(12) United States Patent
Zhang et al.

(10) Patent No.: US 12,392,732 B2
(45) Date of Patent: Aug. 19, 2025

(54) MULTI-SOURCE ILLUMINATION UNIT AND METHOD OF OPERATING THE SAME

(71) Applicant: ASML Netherlands B.V., Veldhoven (NL)

(72) Inventors: Jian Zhang, San Jose, CA (US); Yixiang Wang, Fremont, CA (US); Zhiwen Kang, Milpitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 728 days.

(21) Appl. No.: 17/283,930

(22) PCT Filed: Sep. 20, 2019

(86) PCT No.: PCT/EP2019/075313
§ 371 (c)(1),
(2) Date: Apr. 8, 2021

(87) PCT Pub. No.: WO2020/074238
PCT Pub. Date: Apr. 16, 2020

(65) Prior Publication Data
US 2021/0396683 A1 Dec. 23, 2021

Related U.S. Application Data

(60) Provisional application No. 62/744,558, filed on Oct. 11, 2018.

(51) Int. Cl.
*G01N 21/95* (2006.01)
*G01N 21/88* (2006.01)

(52) U.S. Cl.
CPC ..... *G01N 21/9505* (2013.01); *G01N 21/8806* (2013.01); *G01N 2021/8816* (2013.01);
(Continued)

(58) Field of Classification Search
CPC ....... G01N 21/8806; G01N 2021/8816; G01N 2021/8835; G01N 2021/8845;
(Continued)

(56) References Cited

U.S. PATENT DOCUMENTS

| 4,540,278 A | 9/1985 | Phillips |
| 5,713,661 A * | 2/1998 | White ................ G01N 21/8806 362/17 |

(Continued)

FOREIGN PATENT DOCUMENTS

| CN | 1685197 A | 10/2005 |
| CN | 102472896 A | 5/2012 |

(Continued)

OTHER PUBLICATIONS

Office Action of the Intellectual Property Office issued in related Taiwan Patent Application No. 109143232; mailed Nov. 8, 2021 (14 pgs.).

(Continued)

*Primary Examiner* — Tri T Ton
(74) *Attorney, Agent, or Firm* — Finnegan, Henderson, Farabow, Garrett & Dunner, LLP

(57) ABSTRACT

An illumination unit comprising a first electromagnetic wave source including circuitry for outputting a first electromagnetic wave in a first direction to illuminate a first region of a sample; a second electromagnetic wave source including circuitry for outputting a second electromagnetic wave in a second direction substantially opposite to the first direction; and a reflector configured to reflect the second electromagnetic wave substantially in the first direction to illuminate a second region of the sample.

19 Claims, 13 Drawing Sheets

(52) U.S. Cl.
CPC ........... *G01N 2021/8835* (2013.01); *G01N 2021/8845* (2013.01)

(58) Field of Classification Search
CPC ....... G01N 21/9505; G01N 2021/8812; G01N 21/9501; G03F 7/7065; G02F 1/13306; G02F 1/1334; G06T 2207/20081; G06T 2207/30108; G06T 7/0004; H01L 22/12; H04N 23/56
USPC ............ 356/237.1–237.6, 239.1–239.8
See application file for complete search history.

(56) References Cited

U.S. PATENT DOCUMENTS

| | | | | |
|---|---|---|---|---|
| 2012/0147333 | A1* | 6/2012 | Jorgensen | G03B 21/2033 353/31 |
| 2015/0092001 | A1* | 4/2015 | Yoshida | G02B 26/127 347/118 |
| 2015/0338191 | A1* | 11/2015 | Maryfield | F41G 3/00 345/633 |
| 2017/0082932 | A1 | 3/2017 | Fu et al. | |
| 2019/0015930 | A1* | 1/2019 | Berg | H01S 3/1643 |
| 2023/0168208 | A1* | 6/2023 | Sun | H04N 23/56 348/92 |

FOREIGN PATENT DOCUMENTS

| | | | | |
|---|---|---|---|---|
| EP | 1968115 | A2 | 9/2008 | |
| EP | 3348899 | A1 | 7/2018 | |
| JP | 2004069612 | A | 3/2004 | |
| JP | 2004164967 | A | 6/2004 | |
| JP | 2006-162456 | A | 6/2006 | |
| JP | 2006208258 | A | 8/2006 | |
| JP | 2008-227494 | A | 9/2008 | |
| JP | 2010182583 | A | 8/2010 | |
| JP | 2012104296 | A | 5/2012 | |
| JP | 2017-107201 | A | 6/2017 | |
| JP | 6571900 | B1 * | 9/2019 | ............... F21K 9/65 |
| TW | 200710589 | A | 3/2007 | |
| WO | WO 2017/115290 | A1 | 7/2017 | |

OTHER PUBLICATIONS

Notice of Reasons for Rejection form the Japan Patent Office issued in related Japanese Patent Application No. 2021-515100; mailed May 23, 2022 (13 pgs.).

Taiwan Office Action issued in corresponding Application No. 108134336, mailed Jun. 15, 2020 (12 pages).

International search report in PCT Application No. PCT/EP2019/075313, mailed Nov. 12, 2019 (2 pages).

Notice of Reasons for Rejection from the Japan Patent Office issued in related Japanese Patent Application No. 2021-515100; mailed Aug. 14, 2023 (7 pgs.).

* cited by examiner

MULTI-SOURCE ILLUMINATION UNIT AND METHOD OF OPERATING THE SAME

CROSS-REFERENCE TO RELATED APPLICATIONS

This application claims priority to International Application No. PCT/EP2019/075313, filed Sep. 20, 2019, and published as WO 2020/074238 A1, which claims priority of U.S. application 62/744,558 which was filed on Oct. 11, 2018. The contents of these applications are incorporated herein by reference in their entireties.

FIELD

Apparatuses and methods consistent with the present disclosure relate generally to optics, and more particularly, to illumination units having two electromagnetic wave sources.

BACKGROUND

An illumination unit is one of key components in optical systems for variety of applications, for example, semiconductor wafer inspection system, lithography system, projector system, biological sample imaging system, etc. An illumination unit comprising a light source such as a light emitting diode (LED) lamp or xenon lamp often provides a monotonic electromagnetic wave with a fixed field of view. Further improvements in the art are desired.

SUMMARY

According to some embodiments of the present disclosure, there is provided an illumination unit. The illumination unit comprises a first electromagnetic wave source including circuitry for outputting a first electromagnetic wave in a first direction to illuminate a first region of a sample; a second electromagnetic wave source including circuitry for outputting a second electromagnetic wave in a second direction substantially opposite to the first direction; and a reflector configured to reflect the second electromagnetic wave substantially in the first direction to illuminate a second region of the sample.

The illumination unit may further comprise a first controller including circuitry for controlling the first electromagnetic wave source; and a second controller including circuitry for controlling the second electromagnetic wave source, wherein the first controller and the second controller may operate synergetic or independently.

The illumination unit may further comprise a first moving mechanism controlled by the first controller to move the first electromagnetic wave source, and a second moving mechanism controlled by the second controller to move the second electromagnetic wave source, wherein at least one of the first moving mechanism and the second moving mechanism includes one of a servo motor, a robotic arm, a magnetic levitation system, and a magnetic force control system.

The illumination unit may further comprise a first diffuser that faces an illumination surface of the first electromagnetic wave source and is configured to diffuse the first electromagnetic wave outputted from the first electromagnetic wave source, and a condenser that faces the first diffuser and collimates the first electromagnetic wave diffused through the first diffuser. A diameter of the reflector may be larger than a diameter of the first diffuser and the condenser may have substantially the same size as the first diffuser. The condenser and the first diffuser may be in contact.

The illumination unit may further comprise a second diffuser that faces the reflector and is configured to diffuse the second electromagnetic wave reflected from the reflector. A size of the second diffuser may be larger than a size of the first diffuser. The first diffuser and the second diffuser may be made of the same material or different materials.

The illumination unit may further comprise a projection lens configured to project at least one of the first diffuser and the second diffuser to a predetermined location, wherein a radius of the projection lens is substantially the same as a radius of the second diffuser.

According to some embodiments of the present disclosure, there is provided an illumination unit, comprising: a first diffuser configured to diffuse a first electromagnetic wave from a first electromagnetic waver source onto a first region of a sample; and a second diffuser configured to diffuse a second electromagnetic wave from a second electromagnetic waver source onto a second region of the sample, wherein the first and second electromagnetic waves diffused from the first and second diffusers simultaneously illuminate the first and second regions of the sample. The first diffuser and the second diffuser may overlap each other. A size of the first diffuser may be smaller than a size of the second diffuser. The first diffuser may be placed in a concave portion of the second diffuser such that the first diffuser and the second diffuser are placed on the same plane. In some embodiments of the present disclosure, the first and second electromagnetic wave sources may be arranged in parallel such that the first and second electromagnetic waves originated from the first and second electromagnetic wave sources have the same propagation direction. In some embodiments of the present disclosure, the first and second electromagnetic wave sources may be arranged in the form of back-to-back and the illumination unit may further comprise a reflector that reflects the second electromagnetic wave to a direction substantially the same as a propagation direction of the first electromagnetic wave.

According to some embodiments of the present disclosure, there is provided an illumination device, comprising: a first electromagnetic wave source including circuitry for outputting a first electromagnetic wave in a first direction; a second electromagnetic wave source including circuitry for outputting a second electromagnetic wave in a second direction opposite to the first direction; a first beam expander that faces the first electromagnetic wave source and is configured to expand the outputted first electromagnetic wave to provide an angle of field of view; a beam collimator that faces the first beam expander and is configured to collimate the expanded first electromagnetic wave; a beam reflector faces the second electromagnetic wave source and is configured to reflect the outputted second electromagnetic wave; and a second beam expander that faces the beam reflector and is configured to expand the reflected second electromagnetic wave to provide an angle of field of view. The illumination device may further comprise a projection lens configured to project at least one of the first beam expander and the second beam expander to a predetermined position.

According to some embodiments of the present disclosure, there is provided a method for illuminating a sample, comprising: outputting a first electromagnetic wave in a first direction to illuminate a first region of the sample; outputting a second electromagnetic wave in a second direction substantially opposite to the first direction; and reflecting the second electromagnetic wave substantially in the first direction to illuminate a second region of the sample.

The method may further comprise: passing the first electromagnetic wave through a first beam expander; passing the expanded first electromagnetic wave through a collimator; and passing the reflected second electromagnetic wave through a second beam expander; and passing the collimated first electromagnetic wave and the expanded second electromagnetic wave through a projection lens.

The subject matter below is taught by way of various specific exemplary embodiments explained in detail, and illustrated in the enclosed drawing figures. For the purpose of illustrating the invention, there is shown in the drawings a form that is presently preferred, however, the present invention is not limited to the precise arrangements and instrumentalities shown.

DETAILED DESCRIPTION

Figure 1:
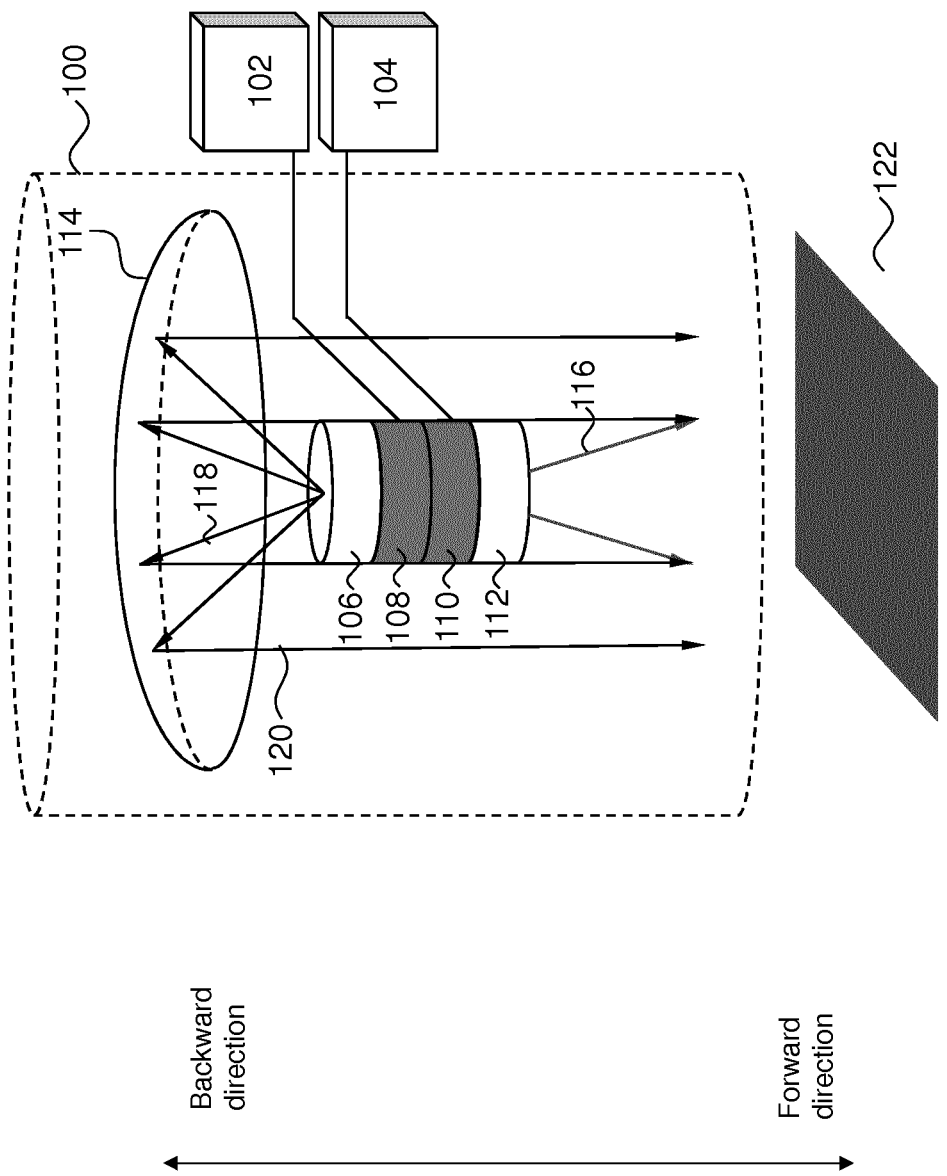
FIG. 1 is a schematic diagram illustrating an exemplary illumination unit having two electromagnetic wave sources arranged in a form of back-to-back, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing visible light, the disclosure is not so limited. Other types of electromagnetic waves, for example, infrared, ultraviolet, x-rays, and fluorescent light be similarly applied.

The enhanced computing power of electronic devices, while reducing the physical size of the devices, can be accomplished by significantly increasing the packing density of circuit components, such as transistors, capacitors, diodes, etc. on an integrated circuit (IC) chip. For example, in a smart phone, an IC chip (which is the size of a thumbnail) may include over 2 billion transistors, the size of each transistor being less than $\frac{1}{1000}$th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

A killer defect can be any fatal damage or defect that occurs in various steps of the semiconductor manufacturing process, including macro/micro cracks or voids on a die, flip-chip underfill void, missing seal, delamination, voids in metal interconnect, and nanometer scale pattern defects, among others. As semiconductor device sizes continually become smaller and smaller (along with any defects), identifying defects becomes more challenging and costly. Currently, engineers in semiconductor manufacturing lines sometimes spend hours (and even days) to identify locations of small detects to minimize their impact on the final product.

Optical imaging offers a large-scale, rapid, and non-destructive inspection method to identify many types of defects. To assist with identifying defects, conventional systems use light sources (e.g., illumination units) that emit light at a specific wavelength across a portion of a wafer, and capture wafer images for further analysis. A wafer to be imaged usually includes different areas having different light reflectivity. For example, in a semiconductor wafer, a metal deposition area may have a higher reflectivity than the area surrounding it. In this case, illuminating the semiconductor wafer with uniform light often results in a captured image having too much contrast; that is, the metal deposition area would be overexposed while the area surrounding would be underexposed. As another example, in a semiconductor wafer including uneven structures, peaks and valleys of the uneven structures may cast hard shadows while the area surrounding the uneven structures optimally reflect an incoming illumination light. The resulting poor quality images in turn cause difficulty or even failure in defect identification, which can decrease performance and reliability of manufactured semiconductor devices, or even can cause failures of the devices. These poor quality images also prolong post-imaging analysis processes, thereby decreasing efficiency of defect inspection and decreasing throughput.

Some embodiments of the present disclosure provide multiple illumination arrangements that contribute to obtaining high quality wafer images, thereby improving accuracy and efficiency of defect identification, which in turn improves performance and reliability of the manufactured semiconductor devices as well as throughput. For example, the disclosed embodiments provide the ability to illuminate different areas of a sample simultaneously with different electromagnetic waves or with different intensities of the same electromagnetic waves. By using these different illumination arrangements, the disclosed embodiments can minimize the effects of contrast and reduce hard shadows that would occur under convention systems. Moreover, the described embodiments provide the ability to adjust the illumination area or the angle of the field of view. By providing the ability to illuminate different areas of the sample simultaneously using multiple-intensity lights or multiple-wavelength lights, the quality of images is improved, which in turn causes the accuracy and efficiency of defect detection is improved, thereby leading to increased throughput.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

References are now made to FIG. 1, a schematic diagram illustrating an exemplary illumination unit having two electromagnetic wave sources arranged in a form of back-to-back, consistent with some embodiments of the present disclosure. As shown in FIG. 1, an illumination unit 100 comprises a first electromagnetic wave source including an illumination surface 112, a wave generator 110 and a controller 104. Wave generator 110 includes circuitry configured to generate a first electromagnetic wave by various methods, for example, by transforming chemical energy into electromagnetic waves. An electromagnetic wave 116 generated from wave generator 110 is emitted through illumination surface 112 and propagates in the forward direction. Controller 104 may control an intensity of electromagnetic wave 116 by controlling wave generator 110, for example, by adjusting a current supplying to the wave generator. Controller 104 may be a component included in the wave generator 110, or a detached component connected to wave generator 110 by a wire or a wireless remote component (not shown) that controls wave generator 110 by a wireless remote signal such as an infrared signal, a radio signal, a WIFI signal, or any telecommunication signals.

Illumination unit 100 may further comprise a second electromagnetic wave source including an illumination surface 106, a wave generator 108 and a controller 102. Wave generator 108 includes circuitry configured to generate a second electromagnetic wave by various methods, for example, by transforming electrical energy into second electromagnetic waves. An electromagnetic wave 118 generated from wave generator 108 is emitted through illumination surface 106 and propagates in a backward direction. Controller 102 may control an intensity of electromagnetic wave 118 by controlling wave generator 108, for example, by adjusting a current supplying to wave generator 108. Wave generator 110 and wave generator 108 may be arranged in a form of back-to-back, that is, wave generator 110 and wave generator 108 are adjacent to each other while illumination surfaces 106 and 112 are spaced apart from each other by wave generators 110 and 108, and illumination surfaces 106 and 112 are facing different directions, e.g., backward and forward directions, respectively.

In some embodiments of the present disclosure, the first electromagnetic wave source and the second electromagnetic wave source may be the same type or different types of electromagnetic wave sources. For example, without limiting the embodiments of the present disclosure, the first electromagnetic wave source may be an organic light emitting diode type while the second electromagnetic wave source may be an inorganic light emitting diode type. A bandwidth of the first electromagnetic wave may be the same as or different from a bandwidth of the second electromagnetic wave. The bandwidths of the first and second electromagnetic waves may be narrow or broad. In some embodiments of the present disclosure, a type of the first or second electromagnetic wave sources may be an inorganic light emitting diode (LED), an organic light emitting diode (OLED), a cold cathode fluorescent lamp, a plasma lamp, a tungsten lamp, a xenon lamp, a mercury arc lamp, or a mercury-xenon discharge lamp, among others. The first and second electromagnetic wave sources may have the same size or different sizes. The intensity of the first electromagnetic wave may be the same as or different from the intensity of the second electromagnetic wave, depending on a control manner of controllers 102 and 104, either synergetic or independently, among others.

Illumination unit 100 further comprises a reflector 114 configured to collimate electromagnetic wave 118 transmitted from the second electromagnetic wave source. A reflection surface of reflector 114 may be a curved mirror such that an incoming electromagnetic wave with various incident angles can be reflected on the surface of the curved mirror to form a substantially parallel electromagnetic wave propagating substantially in the forward direction. In some embodiments, a "substantially parallel electromagnetic wave" means that a deviation of the reflected electromagnetic wave from parallel is less than ±15°, and "substantially in the forward direction" means that a deviation of the reflected electromagnetic wave from the forward direction is less than ±15°. In some embodiments of the present disclosure, a radius of reflector 114 may be two times of a distance between reflector 114 and the second electromagnetic wave source. Reflector 114 is not limited to a curved mirror and can be any collimator or device that can change propagation direction of an electromagnetic wave. Moreover, reflector 114 can filter certain electromagnetic waves so that only those traveling parallel or substantially parallel to a certain direction (the forward direction in this case) are allowed through. By collimating the second electromagnetic wave into the forward direction, illumination unit 100 may substantially simultaneously illuminate a sample 122 with the first electromagnetic wave and the second electromagnetic wave. One skilled in the art would understand that the two electromagnetic waves substantially simultaneously illuminating the sample may include any delay in propagation and detection of the electromagnetic waves and any delay in controlling the illumination units. In some embodiments of the present disclosure, controllers 102 and 104 may control the onset time of output of electromagnetic waves 118 and 116 by controlling wave generators 108 and 110, respectively, such that there is a controlled duration between the output of electromagnetic wave 118 and the output of electromagnetic wave 116.

Figure 2:
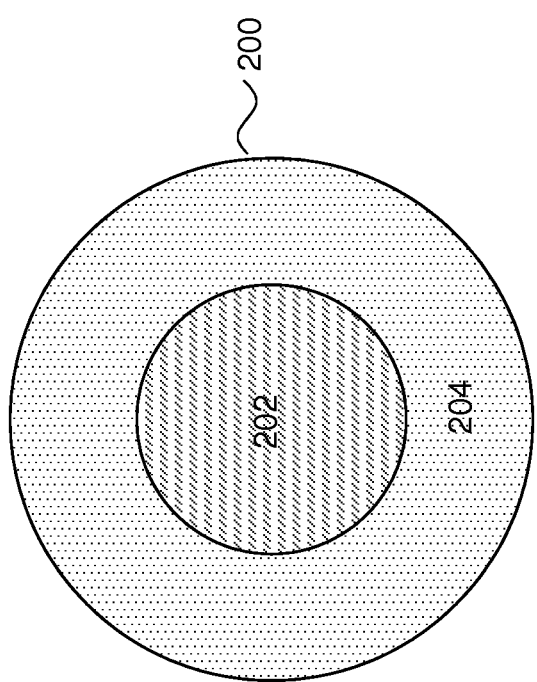
FIG. 2 is a schematic diagram illustrating a surface of a sample illuminated by the illumination unit of FIG. 1, consistent with some embodiments of the present disclosure.

References are now made to FIG. 2, a schematic diagram illustrating a surface of a sample illuminated by the illumination unit of FIG. 1, consistent with some embodiments of the present disclosure. As shown in FIG. 2, a surface 200 of a sample includes a region 202 that is illuminated by the first electromagnetic wave, and a region 204 that is illuminated by the second electromagnetic wave. Region 202 and region 204 may be illuminated by two different electromagnetic waves, for example, region 202 may be illuminated by fluorescent light while region 204 is illuminated by white light, or may be illuminated by same electromagnetic waves, for example, white light. Region 202 and region 204 may be illuminated by the same electromagnetic wave having different intensities, for example, region 202 may be illuminated with a high-intensity light while region 204 is illuminated with a low-intensity light. Using the illumination unit of FIG. 1, two different regions of a sample can be observed or imaged differently, under the illumination with two different electromagnetic waves.

Figure 3:
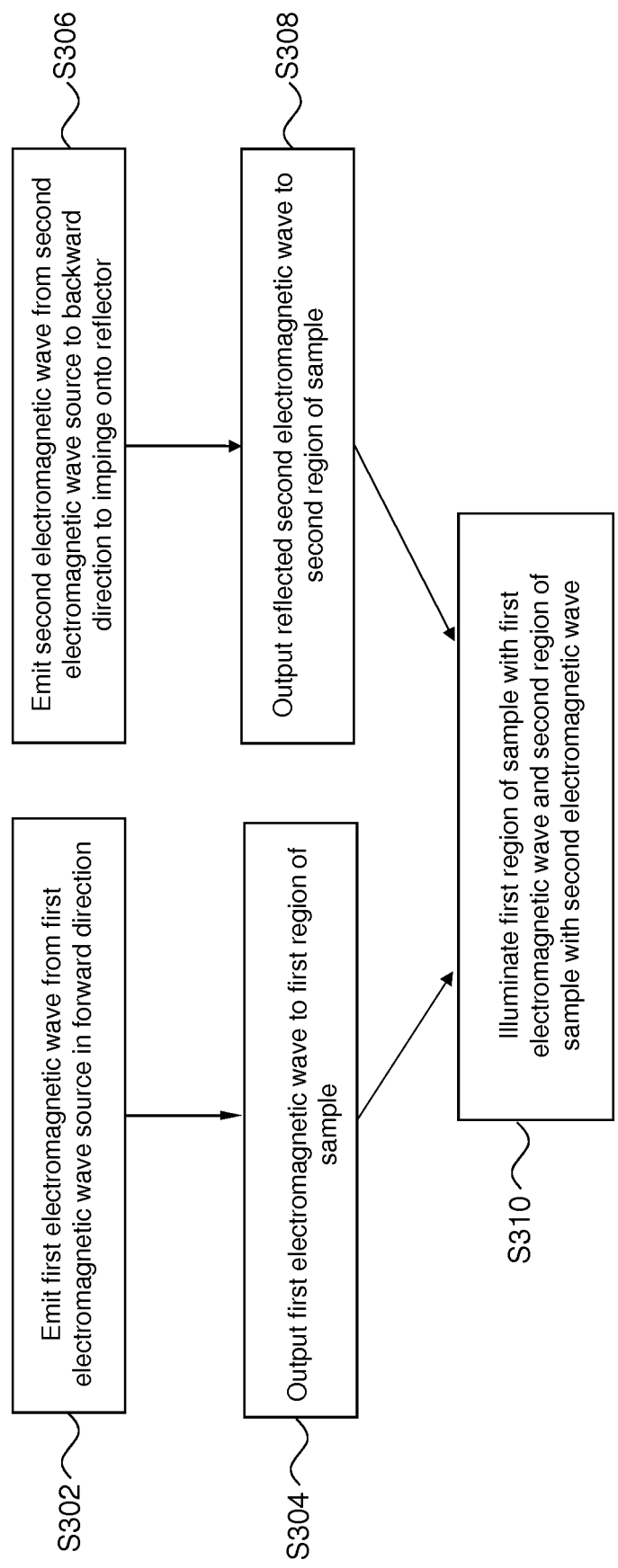
FIG. 3 is a flowchart indicating an exemplary method of operating an illumination unit of FIG. 1, consistent with some embodiments of the present disclosure.

References are now made to FIG. 3, a flowchart indicating an exemplary method of operating an illumination unit as shown in FIG. 1, consistent with some embodiments of the present disclosure. In FIG. 3, steps S302 and S304 describe the steps of operating the first electromagnetic wave source. In step S302, the first electromagnetic wave is emitted from the first electromagnetic wave source, such as wave generator 110 of FIG. 1, and transmitted in the forward direction, as is electromagnetic wave 116. The first electromagnetic wave may be a narrow bandwidth or a broad bandwidth electromagnetic wave, among others. In step S304, the first electromagnetic wave outputs into a first region of a sample, such as region 202 of FIG. 2. In FIG. 3, steps S306 and S308 describe the steps of operating the second electromagnetic wave source. In step S306, the second electromagnetic wave, such as wave 118 of FIG. 1, is emitted from the second electromagnetic wave source, such as wave generator 108, and is transmitted in the backward direction to impinge onto a reflector, such as reflector 114 of FIG. 1. In step S308, the second electromagnetic wave reflected and collimated by the reflector, propagates in the forward direction, and outputs into a second region of the sample, such as region 204 of FIG. 2. As a result, in step S310, the first region of the sample is illuminated by the first electromagnetic wave, while the second region of the sample is illuminated by the second electromagnetic wave. In some embodiments of the present disclosure, the first and second electromagnetic waves may substantially simultaneously illuminate the first region and the second region of the sample. One skilled in the art would understand that the two electromagnetic waves substantially simultaneously illuminating the first and second region of the sample may include any delay in propagation and detection of the electromagnetic waves and any delay in controlling the illumination units. In some embodiments of the present disclosure, the onset times of output of the first and second electromagnetic waves are controlled such that there is a controlled duration between the output of the first electromagnetic wave and the output of the second electromagnetic wave.

Figure 4:
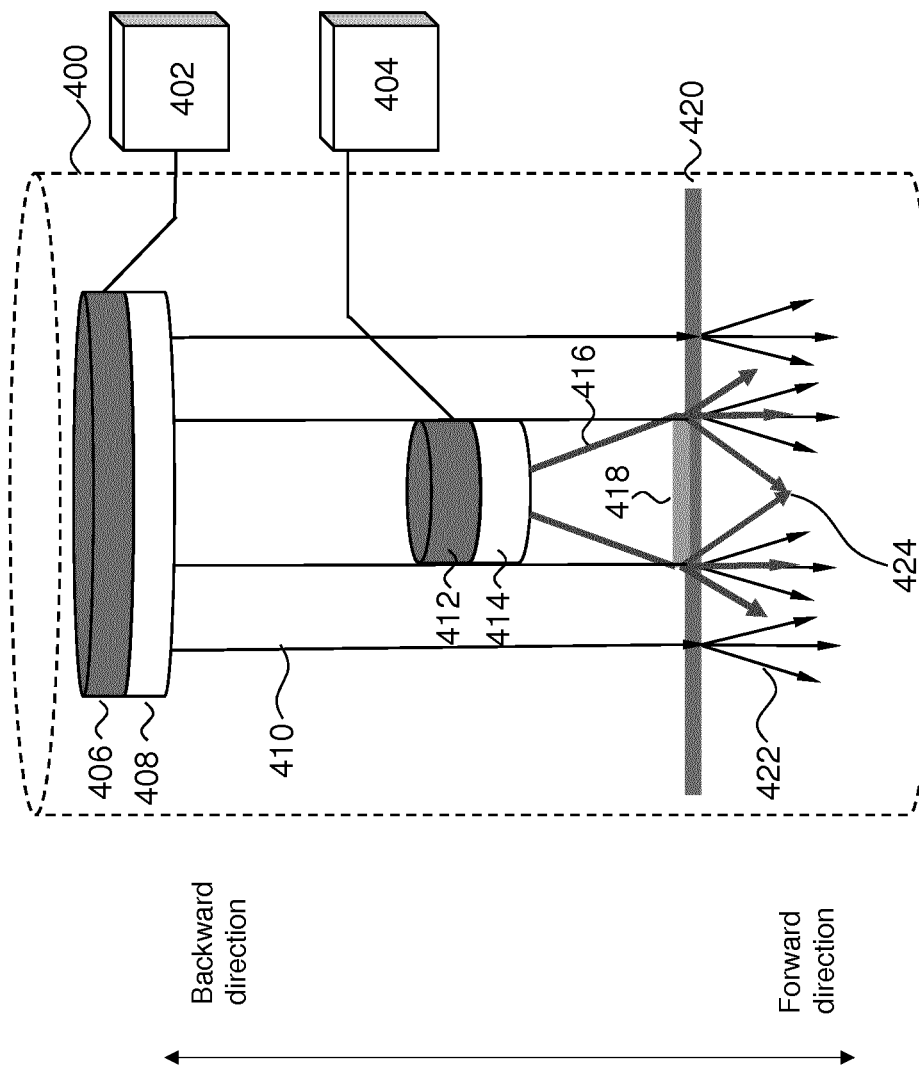
FIG. 4 is a schematic diagram illustrating another exemplary illumination unit having two electromagnetic wave sources arranged with the illumination surfaces facing at the same direction, consistent with some embodiments of the present disclosure.

References are now made to FIG. 4, a schematic diagram illustrating another exemplary illumination unit having two electromagnetic wave sources arranged with the illumination surfaces facing at the same direction, consistent with some embodiments of the present disclosure. As shown in FIG. 4, an illumination unit 400 comprises a first electromagnetic wave source including an illumination surface 414, a wave generator 412 and a controller 404. Wave generator 412 includes circuitry configured to generate a first electromagnetic wave by various methods, for example, by transforming a chemical energy into electromagnetic waves. An electromagnetic wave 416 generated from the wave generator 412 is emitted through illumination surface 414 and propagates in the forward direction. Controller 404 may control intensity of electromagnetic wave 416 by controlling wave generator 412, for example, by adjusting a current supplying to the wave generator 412. Controller 404 may be a component included in the wave generator 412, or a detached component connected to wave generator 412 by a wire or a wireless remote component (not shown) that controls wave generator 412 by a remote signal such as an infrared signal, radio signal, a WIFI signal, or any telecommunication signal.

Figure 5:
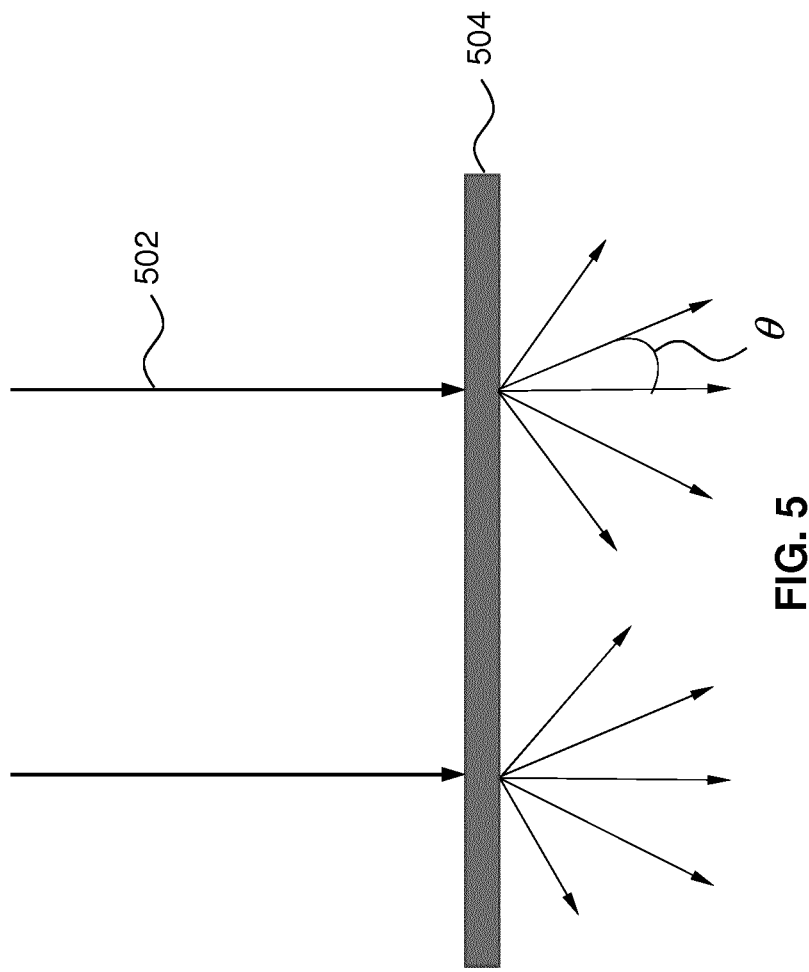
FIG. 5 is a schematic diagram illustrating wave transmitted through a diffuser, showing a working mechanism of a diffuser, consistent with some embodiments of the present disclosure.

In some embodiments, illumination unit 400 further comprises a diffuser 418 that faces illumination surface 414 of the first electromagnetic wave source. Diffuser 418 is configured to diffuse the incoming electromagnetic wave 418 transmitted from the first electromagnetic wave source. In some embodiments of the present disclosure, diffuser 418 may be any beam expander that faces illumination surface 414 of the first electromagnetic wave source and is configured to expand electromagnetic wave 418 to provide a desired field of view. The working mechanism of a diffuser is schematically shown in FIG. 5. As shown in FIG. 5, when electromagnetic wave 502 enters a diffuser 504, the electromagnetic wave is redistributed due to the scattering of the electromagnetic wave in the diffuser. The scattered electromagnetic wave with a certain scattering angle (as shown as θ angle) occupies the maximum intensity, and electromagnetic wave intensity decreases with the increase of the scattering angle θ. A full viewing angle of diffuser 504 may be defined by the electromagnetic wave with a scattering angle where the intensity of the electromagnetic wave decreases to 50% of a maximum intensity of the electromagnetic wave.

Referring back to FIG. 4, illumination unit 400 further comprises a second electromagnetic wave source including an illumination surface 408, a wave generator 406 and a controller 402. Wave generator 406 includes circuitry configured to generate a second electromagnetic wave by various methods, for example, by transforming an electrical energy into the second electromagnetic wave. An electromagnetic wave 410 generated from the wave generator 406 is emitted through illumination surface 408 and propagates in the forward direction. Controller 402 may control an intensity of electromagnetic wave 410 by controlling wave generator 406, for example, by adjusting a current supplying to the wave generator.

In some embodiments, illumination unit 400 further comprises a diffuser 420 that faces illumination surface 408 of the second electromagnetic wave source. Diffuser 420 is configured to diffuse the incoming electromagnetic wave 410 transmitted from the second electromagnetic wave source. A size of diffuser 420 may be greater than a size of diffuser 418. Diffuser 418 and diffuser 420 may overlap each other. Diffuser 418 may be placed in a concave portion of diffuser 420 such that diffuser 418 and diffuser 420 are placed on the same plane. Diffuser 418 and diffuser 420 may be made of the same material or different materials.

Electromagnetic wave 416 diffused through diffuser 418 merges with electromagnetic wave 410 diffused through diffuser 420 to form a large illumination area. And, diffuser 420 may be selected to have a viewing angle smaller than that of diffuser 418, as schematically shown by scattering angle of diffused electromagnetic waves 422 and 424. In this way, illumination unit 400 can provide a large illumination area with small angle of field of view. Also, diffuser 420 and diffuser 418 may be selected from different materials having different degree of light scattering such that diffused electromagnetic waves 422 and 424 have different qualities (e.g., softness/hardness). For example, diffuser 418 may be selected to have a degree of light scattering higher than that of diffuser 420 such that a light diffused through diffuser 418 is soft light while a light diffused through diffuser 420 is a hard light. In this way, illumination unit 400 can provide two different electromagnetic waves having different levels of softness/hardness.

Figure 6:
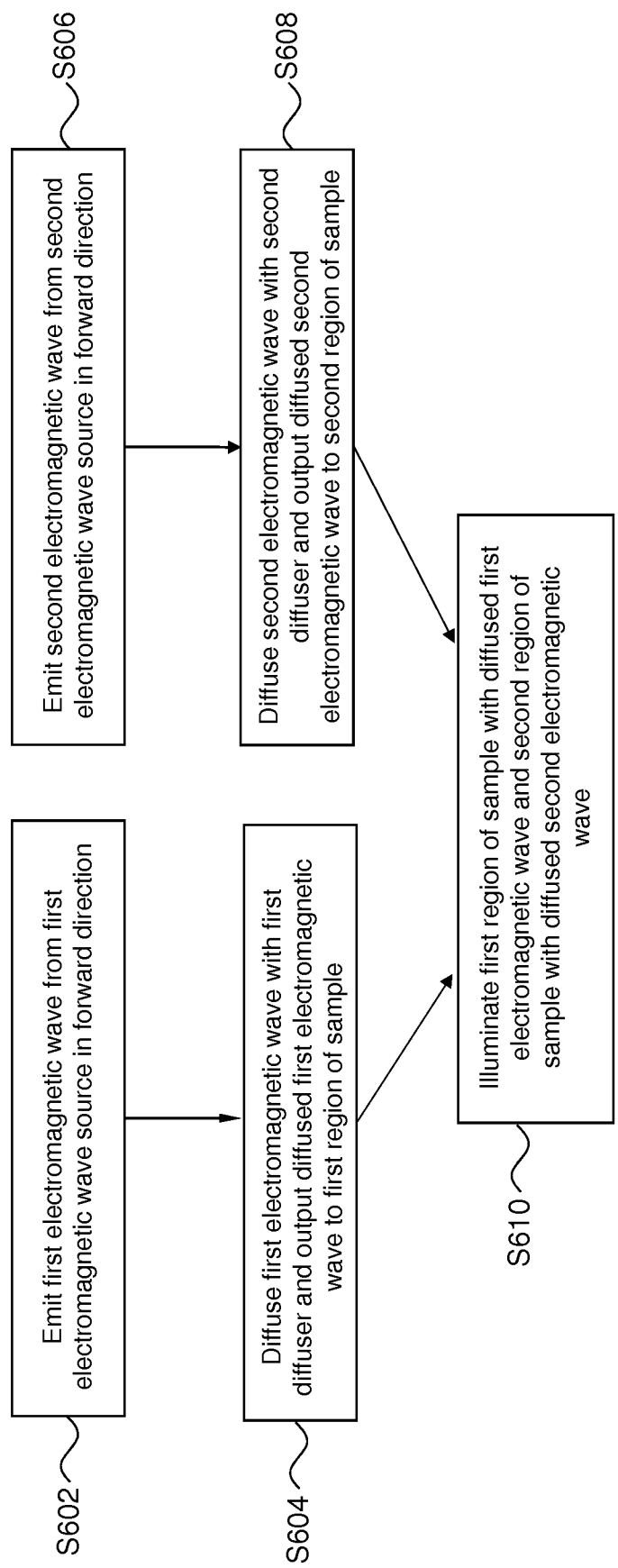
FIG. 6 is a flowchart indicating an exemplary method of operating an illumination unit of FIG. 4, consistent with some embodiments of the present disclosure.

References are now made to FIG. 6, a flowchart indicating an exemplary method of operating an illumination unit as shown in FIG. 4, consistent with some embodiments of the present disclosure. In FIG. 6, steps S602 and S604 describe the steps of operating the first electromagnetic wave source. In step S602, the first electromagnetic wave, such as electromagnetic wave 416 of FIG. 4, is emitted from the first electromagnetic wave source, such as wave generator 412 of FIG. 4, and transmitted in the forward direction. The first electromagnetic wave may be a narrow bandwidth or a broad bandwidth electromagnetic wave, among others. In step S604, the first electromagnetic wave enters a first diffuser, such as diffuser 418 of FIG. 4, and the diffused first electromagnetic wave illuminates a first region of a sample.

In FIG. 6, steps S606 and S608 describe the steps of operating the second electromagnetic wave source. In step S606, the second electromagnetic wave, such as electromagnetic wave 410, is emitted from the second electromagnetic wave source, such as wave generator 406, and transmitted in the forward direction. The second electromagnetic wave may be a narrow bandwidth or a broad bandwidth electromagnetic wave, among others. In step S608, the second electromagnetic wave enters a second diffuser, such as diffuser 420, and the diffused second electromagnetic wave illuminates a second region of a sample. In some embodiments, the first region and the second region overlap, while in other embodiments, they do not overlap. As a result, in step S610, the first region of the sample is illuminated by the diffused first electromagnetic wave, while the second region of the sample is illuminated by the diffused second electromagnetic wave. The second diffuser may be selected to have a viewing angle smaller than that of the first diffuser, in this way, the sample may have a large illumination area with small angle of field of view. The second diffuser may be selected to have a degree of scattering smaller than that of the first diffuser. In this way, the sample may be illuminated by two electromagnetic waves having two different levels of softness, in this case, a softer first electromagnetic wave is surrounded by a harder second electromagnetic wave, which may partially or entirely overlap the first electromagnetic wave.

Figure 7:
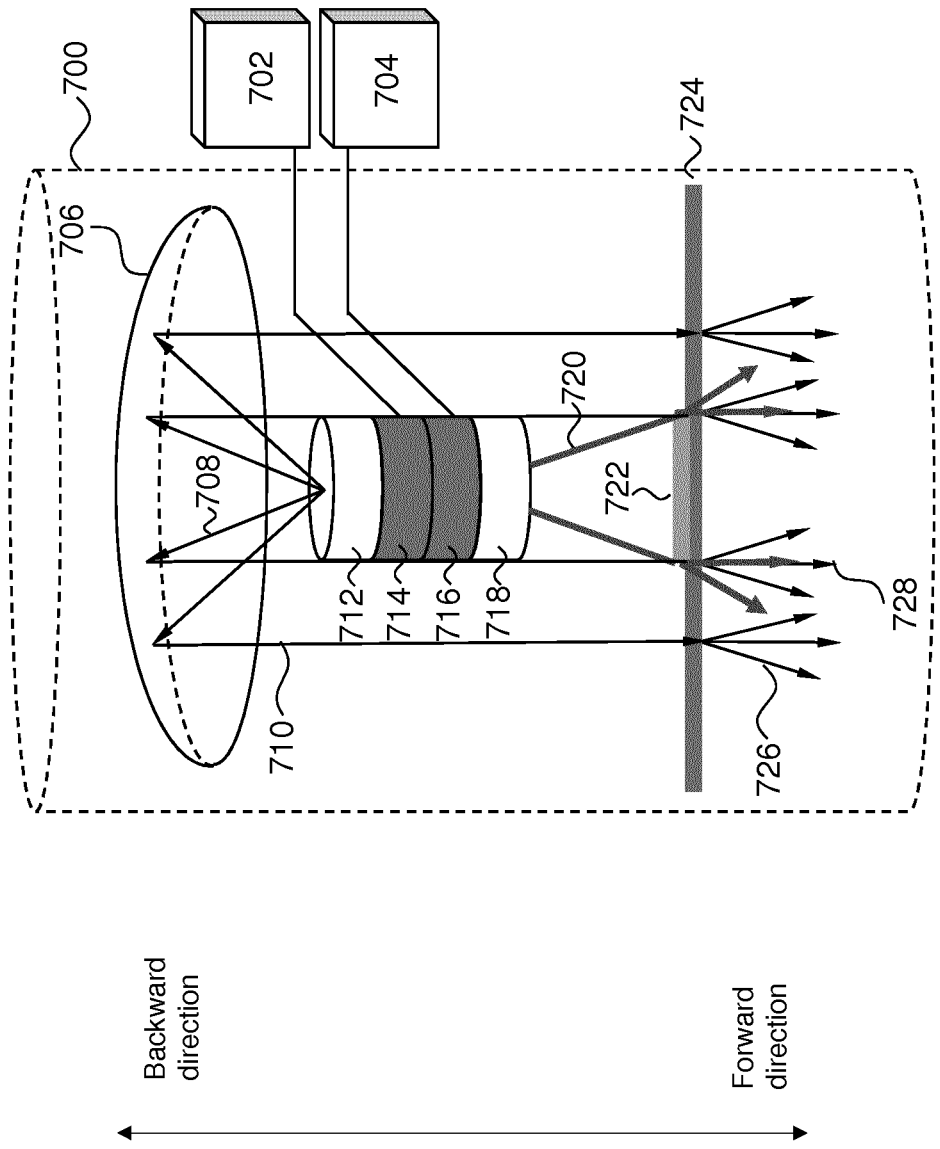
FIG. 7 is a schematic diagram illustrating another exemplary illumination unit having two electromagnetic wave sources arranged in a form of back-to-back, consistent with some embodiments of the present disclosure.

References are now made to FIG. 7, a schematic diagram illustrating an exemplary illumination unit having two electromagnetic wave sources arranged in a form of back-to-back, consistent with some embodiments of the present disclosure. As shown in FIG. 7, an illumination unit 700 comprises a first electromagnetic wave source including an illumination surface 718, a wave generator 716 and a controller 704. Wave generator 716 includes circuitry configured to generate a first electromagnetic wave by various methods, for example, by transforming a chemical energy into an electromagnetic wave. An electromagnetic wave 720 generated by wave generator 716 is emitted through illumination surface 718 and propagates in the forward direction. Controller 704 may control an intensity of electromagnetic wave 720 by controlling wave generator 716, for example, by adjusting a current supplying to wave generator 716. Controller 704 may be a component included in the wave generator 716, or a detached component connected to wave generator 716 by a wire, or a wireless remote component (not shown) that controls wave generator 716 by a remote signal such as an infrared signal, a radio signal, a WIFI signal or any telecommunication signal.

In some embodiments, illumination unit 700 further comprises a diffuser 722 that faces illumination surface 718 of the first electromagnetic wave source. Diffuser 722 is configured to diffuse the incoming electromagnetic wave 720 transmitted from the first electromagnetic wave source.

Illumination unit 700 may further comprise a second electromagnetic wave source including an illumination surface 712, a wave generator 714 and a controller 702. Wave generator 714 includes circuitry configured to generate a second electromagnetic wave by various methods, for example, by transforming an electrical energy into the second electromagnetic wave. An electromagnetic wave 708 generated by wave generator 714 is emitted through illumination surface 712 and propagates in the backward direction. Controller 702 may control an intensity of electromagnetic wave 708 by controlling wave generator 714, for example, by adjusting a current supplying to the wave generator. Wave generator 714 and wave generator 716 may be arranged in the form of previously defined back-to-back configuration.

In some embodiments of the present disclosure, the first electromagnetic wave source and the second electromagnetic wave source may be the same type or different types of electromagnetic wave sources. A bandwidth of the first electromagnetic wave may be the same as or different from a bandwidth of the second electromagnetic wave. The bandwidths of the first and second electromagnetic waves may be narrow or broad. In some embodiments of the present disclosure, a type of the first and second electromagnetic wave sources may be an inorganic light emitting diode (LED), an organic light emitting diode (OLED), a cold cathode fluorescent lamp, a plasma lamp, a tungsten lamp, a xenon lamp, a mercury arc lamp, or a mercury-xenon discharge lamp, among others. The first and second electromagnetic wave sources may have the same size or different sizes. The intensity of the first electromagnetic wave may be the same as or different from the intensity of the second electromagnetic wave, depending on a manner of controllers 102 and 104, either synergetic or independently, among others.

Illumination unit 700 further comprises a reflector 706 configured to reflect and collimate electromagnetic wave 708 transmitted from the second electromagnetic wave source. A reflection surface of reflector 706 may be a curved mirror such that an incoming electromagnetic wave with various incident angles can be reflected on the surface of the curved mirror to form a parallel electromagnetic wave propagating in forward direction. Reflector 706 is not limited to a curved mirror, it can be any collimator or device that can change propagation direction of an electromagnetic wave or can filter certain electromagnetic waves so that only those traveling parallel or substantially parallel to a certain direction (the forward direction in this case) are allowed through.

Illumination unit 700 further comprises a diffuser 724 that faces reflector 706. Diffuser 724 is configured to diffuse the incoming reflected second electromagnetic wave 710. A size of diffuser 724 may be greater than a size of diffuser 722. A size of diffuser may be similar to a size of reflector 706. Diffuser 722 and diffuser 724 may overlap each other. Diffuser 722 may be placed in a concave portion of diffuser 724 such that diffuser 722 and diffuser 724 are placed on the same plane. Diffuser 722 and diffuser 724 may be made of the same material or different materials. Electromagnetic wave 720 diffused through diffuser 722 merges with electromagnetic wave 710 diffused through diffuser 724 to form a large illumination area. And, diffuser 724 may be selected to have a viewing angle smaller than that of diffuser 722, as schematically shown by scattering angle of diffused electromagnetic waves 726 and 728. In this way, illumination unit 700 can provide a large illumination area with small angle of field of view. Also, diffuser 722 and diffuser 724 may be selected from different materials having different degree of light scattering such that diffused electromagnetic waves 726 and 728 have different qualities (e.g., softness/hardness). For example, diffuser 724 may be selected to have a degree of light scattering higher than that of diffuser 722 such that a light diffused through diffuser 724 is soft light while a light diffused through diffuser 722 is a hard light. In this way, illumination unit 700 can provide two different electromagnetic waves having different levels of softness/hardness.

Figure 8:
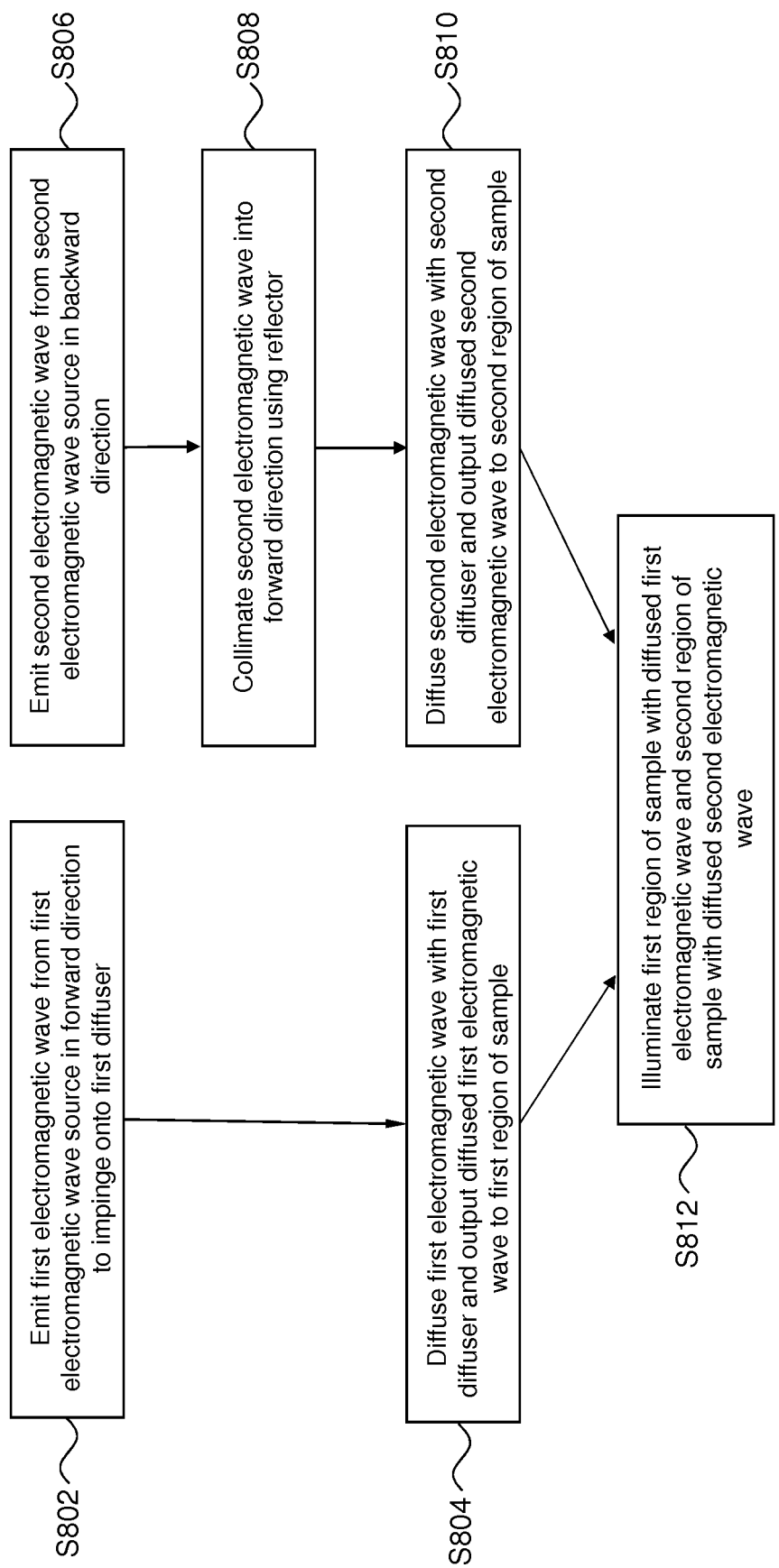
FIG. 8 is a flowchart indicating an exemplary method of operating an illumination unit of FIG. 7, consistent with some embodiments of the present disclosure.

References are now made to FIG. 8, a flowchart indicating an exemplary method of operating an illumination unit as shown in FIG. 7, consistent with some embodiments of the present disclosure. In FIG. 8, steps S802 and S804 describe the steps of operating the first electromagnetic wave source. In step S802, the first electromagnetic wave, such as electromagnetic wave 720 of FIG. 7, is emitted from the first electromagnetic wave source, such as wave generator 716 of FIG. 7, and is transmitted in the forward direction. The first electromagnetic wave may be a narrow bandwidth or a broad bandwidth electromagnetic wave, among others. In step S804, the first electromagnetic wave enters a first diffuser, such as diffuser 722 of FIG. 7, and the diffused first electromagnetic wave illuminates a first region of a sample.

In FIG. 8, steps S806-S810 describe the steps of operating the second electromagnetic wave source. In step S806, the second electromagnetic wave, such as electromagnetic wave 708 of FIG. 7, is emitted from the second electromagnetic wave source and transmitted in the backward direction. The second electromagnetic wave may be a narrow bandwidth or a broad bandwidth electromagnetic wave, among others. In step S808, the second electromagnetic wave is reflected and collimated by a reflector and propagates in the forward direction. In step S810, the reflected second electromagnetic wave enters a second diffuser, such as diffuser 724 of FIG. 7, and the diffused second electromagnetic wave illuminates a second region of a sample. As a result, in step S812, the first region of the sample is illuminated by the diffused first electromagnetic wave, while the second region of the sample is illuminated by the diffused second electromagnetic wave (e.g., such as shown in FIG. 2). Second diffuser may be selected to have a viewing angle smaller than that of the first diffuser. In this way, the sample may have a large illumination area with small angle of field of view. The second diffuser may be selected to have a degree of scattering smaller than that of the first diffuser. In this way, the sample may be illuminated by two electromagnetic waves having two different levels of softness, in this case, a softer first electromagnetic wave is surrounded by a harder second electromagnetic wave.

Figure 9:
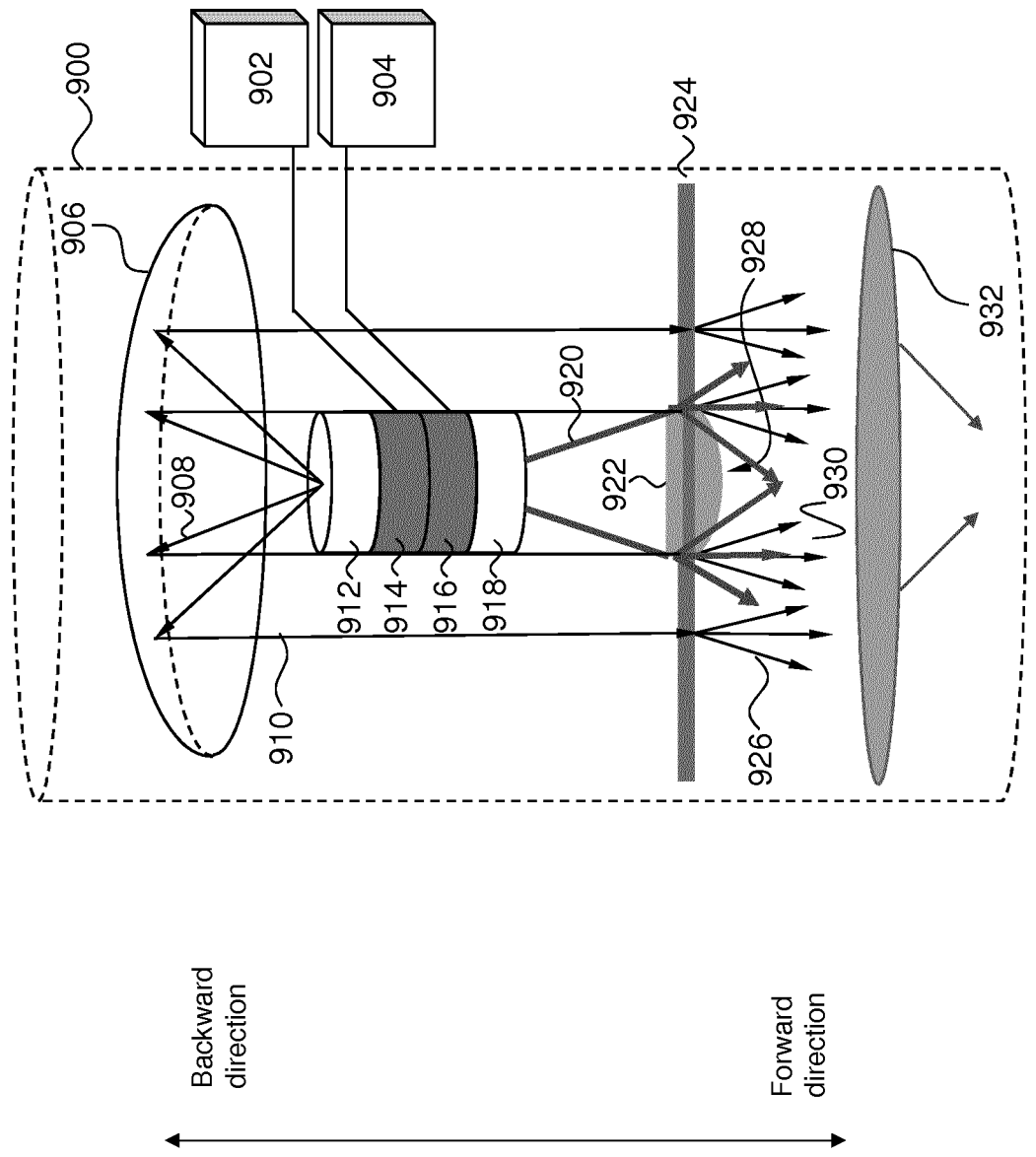
FIG. 9 is a schematic diagram illustrating another exemplary illumination unit having two electromagnetic wave sources arranged in a form of back-to-back, consistent with some embodiments of the present disclosure.

References are now made to FIG. 9, a schematic diagram illustrating an exemplary illumination unit having two electromagnetic wave sources arranged in the form of the previously defined back-to-back configuration, consistent with some embodiments of the present disclosure. As shown in FIG. 9, an illumination unit 900 comprises a first electromagnetic wave source including an illumination surface 918, a wave generator 916 and a controller 904. Wave generator 916 includes circuitry configured to generate a first electromagnetic wave by various methods, for example, by transforming a chemical energy into electromagnetic wave. An electromagnetic wave 920 generated by wave generator 916 is emitted through illumination surface 918 and propagates in the forward direction. Controller 904 may control intensity of electromagnetic wave 920 by controlling wave generator 916, for example, by adjusting a current supplying to the wave generator. Controller 904 may be a component included in the wave generator 916, or a detached component connected to wave generator 916 by a wire, or a wireless remote component (not shown) that controls wave generator 916 by a remote signal.

In some embodiments, illumination unit 900 further comprises a diffuser 922 that faces illumination surface 918 of the first electromagnetic wave source. Diffuser 922 is configured to diffuse the incoming electromagnetic wave 920 transmitted from the first electromagnetic wave source. In some embodiments of the present disclosure, diffuser 922 and illumination surface 918 may have circular shapes having substantially the same radius. Here, "substantially the same radius" means that there may be up to ±10% difference in a radius of diffuser 922 and a radius of illumination surface 918.

Illumination unit 900 further comprises a condenser 928 that faces diffuser 922. Condenser 928 is configured to collimate incoming electromagnetic wave transmitted through diffuser 922. Condenser 928 may be an optical collimator such as a lens, but not limited to a lens. Condenser 928 can be any collimator or device that can change propagation direction of electromagnetic wave or can filter certain electromagnetic wave so that only those traveling parallel or substantially parallel to a certain direction (forward direction in this case) are allowed through. Condenser 928 is not limited to an optical collimator; it may be any element or device configured to converge incoming electromagnetic wave transmitted through diffuser 922. Condenser 928 may provide both collimating and converging function at the same time. Condenser 928 and diffuser 922 may be in contact or spaced apart from each other. Condenser 928 may have a size substantially the same as or different from a size of diffuser 922. Here, "substantially the same" means that there may be up to ±10% difference in the size of condenser 928 and the size of diffuser 922.

Illumination unit 900 further comprises a second electromagnetic wave source including an illumination surface 912, a wave generator 914 and a controller 902. Wave generator 914 includes circuitry configured to generate a second electromagnetic wave by various methods, for example, by transforming an electrical energy into the second electromagnetic wave. An electromagnetic wave 908 generated by wave generator 914 is emitted through illumination surface 912 and propagates in the backward direction. Controller 902 may control intensity of electromagnetic wave 908 by controlling wave generator 914, for example, by adjusting a current supplying to the wave generator. Wave generator 914 and wave generator 916 may be arranged in the form of back-to-back in which the wave generators that completely overlap or partially overlap.

In some embodiments of the present disclosure, the first electromagnetic wave source and the second electromagnetic wave source may be the same type or different types of electromagnetic wave sources. A bandwidth of the first electromagnetic wave may be the same as or different from a bandwidth of the second electromagnetic wave. The bandwidths of the first and second electromagnetic waves may be narrow or broad, among others. In some embodiments of the present disclosure, a type of the first and second electromagnetic wave sources may be an inorganic light emitting diode (LED), an organic light emitting diode (OLED), a cold cathode fluorescent lamp, a plasma lamp, a tungsten lamp, a xenon lamp, a mercury arc lamp, or a mercury-xenon discharge lamp, among others. The first and second electromagnetic wave sources may have the same size or different sizes. The intensity of the first electromagnetic wave may be the same as or different from the intensity of the second electromagnetic wave, depending on a manner of controllers 102 and 104, either synergetic or independently.

Illumination unit 900 further comprises a reflector 906 configured to collimate electromagnetic wave 908 transmitted from the second electromagnetic wave source. A reflection surface of reflector 906 may be a curved mirror such that an incoming electromagnetic wave with various incident angles can be reflected on the surface of the curved mirror to form a parallel electromagnetic wave propagating in forward direction. Reflector 906 is not limited to a curved mirror; it can be any collimator or device that can change propagation direction of an electromagnetic wave or can filter certain electromagnetic waves so that only those traveling parallel or substantially parallel to a certain direction (forward direction in this case) are allowed through.

Illumination unit 900 further comprises a diffuser 924 that faces reflector 906. Diffuser 924 is configured to diffuse the incoming reflected second electromagnetic wave 910. A size of diffuser 924 may be greater than a size of diffuser 922. A size of diffuser 924 may be similar to a size of reflector 906. Diffuser 922 and diffuser 924 may overlap each other. Diffuser 922 may be placed in a concave portion of diffuser 924 such that diffuser 922 and diffuser 924 are placed on the same plane. Diffuser 922 and diffuser 924 may be made of the same material or different materials.

The first electromagnetic wave emitted from the first electromagnetic wave source is collimated or converged by condenser 928. Also, before condenser 928, the first electromagnetic wave transmitted through diffuser 922 and redistributed by the diffuser. In this way, a relatively small illumination area with large angle of field of view can be obtained. Electromagnetic wave 920 transmitted through diffuser 922 and condenser 928 merges with electromagnetic wave 910 diffused through diffuser 924 to form a large illumination area. And, diffuser 924 may be selected to have a viewing angle smaller than that of diffuser 922, as schematically shown by scattering angles of diffused electromagnetic waves 926 and 930. In this way, illumination unit 900 can provide a large illumination area with small angle of field of view. Electromagnetic wave 930 illuminates a first area of a sample and electromagnetic wave 926 illuminates a second area of the sample. The first area and the second area may overlap, or may not overlap.

Diffuser 922 and diffuser 924 may be selected from different materials having different degree of light scattering such that diffused electromagnetic waves 926 and 928 have different qualities (e.g., softness/hardness). For example, diffuser 924 may be selected to have a degree of light scattering higher than that of diffuser 922 such that a light diffused through diffuser 924 is soft light while a light diffused through diffuser 922 is a hard light. In this way, illumination unit 900 can provide two different electromagnetic waves having different levels of softness/hardness.

Controller 902 and controller 904 may operate synergistically or independently. Controller 902 and controller 904 may control the luminous flux of the two electromagnetic wave sources, respectively. By tuning their respective control circuits, the available luminous flux into the image system for illumination can be balanced for different fields of view.

The two electromagnetic wave sources may operate at the same time. When the first electromagnetic wave source is switched off while keeping the second electromagnetic wave source on, the illumination unit gives a ring shape illumination. In this way, the illumination unit behaves like a dark field mode, which indicates that the high frequency feature is activated while low frequency feature is inactivated. Contrast of an image can be enhanced in such an illumination mode.

By way of example, in some embodiments of the present disclosure, a green LED with a wavelength ranging between 515-575 nm is used for the first and second electromagnetic wave sources. The viewing angle of the LED at 50% relative luminous intensity is about 120o, while the viewing angle at 85% relative luminous intensity is about 60o. In order to make the illumination in the full field of view relatively uniform, the 60o viewing angle may be used. With the thermal sink, the LED size may be Φ=10 mm. For an illumination in the forward direction, a diffuser 922 with size of Φ=10 mm is placed in front of illumination surface 918. A separation distance between illumination surface 918 and diffuser 922 is about 8.66 mm. Following diffuser 922, a collector lens 928 with effective focal length of about 8.66 mm is used such that the light from illumination surface 918 is diffused through diffuser 922 and collimated by collector lens 928. Diffuser 922 has a uniform scattering light angle of ±30o. In this way, for the illumination in the forward direction, an illumination area of Φ=10 mm with an angle of field of view of 30o may be achieved.

On the other hand, for an illumination in the backward direction, the 60o viewing angle of illumination surface 912 is also used. A reflector 906 is placed in front of illumination surface 912. A separation distance between reflector 906 and illumination surface 912 is about 30 mm. The radius of curvature of reflector 906 is about 60 mm. The light from LED source 2 is collimated by reflector 906 and propagates in the forward direction. A diffuser 924 facing reflector 906 is placed such that light collimated by reflector 906 is diffused through diffuser 924. Diffuser 924 is contacted and concentric with diffuser 922. Diffuser 924 has a size of Φ=30 mm, and its uniform scattering light angle is about ±10o. In this way, for the illumination in backward direction, an illumination area of Φ=30 mm with an angle of field of view of 10o may be achieved.

Illumination unit 900 may further comprise a projection lens 932 that projects the electromagnetic wave originated from the two electromagnetic wave sources, consistent with some embodiments of the present disclosure. Projection lens 932 may direct the incoming electromagnetic wave to a specific location, depending on a magnification of the lens. When the back focal plane of condenser 928 does not overlap with the diffusers, a projection lens with appropriate magnification factor can be used to conjugate the diffusers onto the back focal plane of the condenser. The magnification factor can be tuned by changing the distance between the projection lens and the diffusers.

Figure 10:
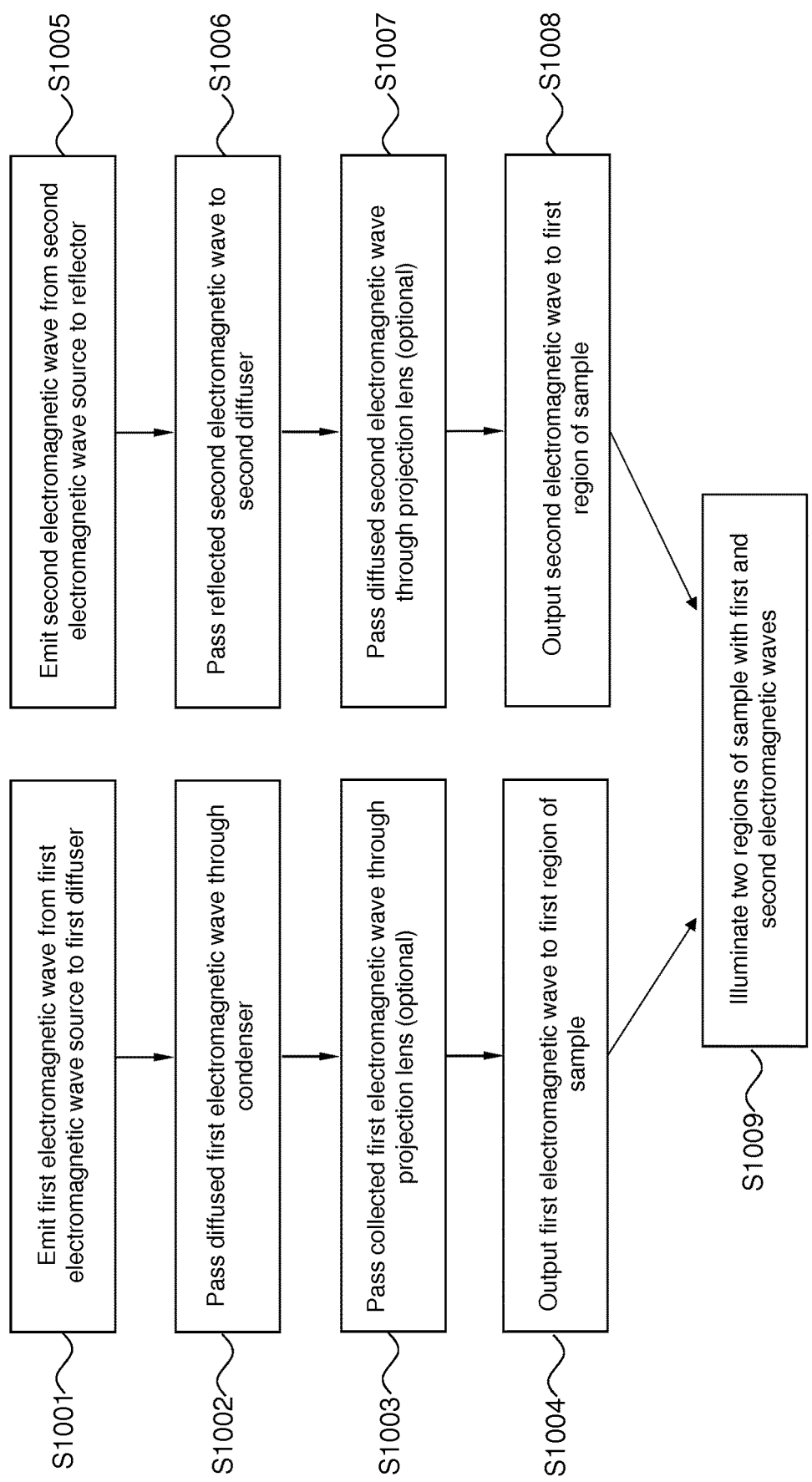
FIG. 10 is a flowchart indicating an exemplary method of operating an illumination unit of FIG. 9, consistent with some embodiments of the present disclosure.

References are now made to FIG. 10, a flowchart indicating an exemplary method of operating an illumination unit having two electromagnetic wave sources as shown in FIG. 9, consistent with some embodiments of the present disclosure. In FIG. 10, steps S1001 to S1004 describe the steps of operating the first electromagnetic wave source. In step S1001, a first electromagnetic wave, such as electromagnetic wave 920 of FIG. 9, is emitted from a first electromagnetic wave source and transmitted to a first diffuser, such as diffuser 922 of FIG. 9, in the forward direction. The first electromagnetic wave source may be a narrow bandwidth or a broad bandwidth electromagnetic wave, among others. The first diffuser redistributes the incoming first electromagnetic wave by a scattering mechanism. The scattered first electromagnetic wave with a certain scattering angle occupies the maximum intensity, and electromagnetic wave intensity decreases with an increase of the scattering angle. In step S1002, the diffused first electromagnetic wave is passed through a condenser, such as condenser 928 of FIG. 9, facing the first diffuser. The condenser may collect the first electromagnetic wave by collimating or converging the diffused first electromagnetic wave in the forward direction. In step S1003, as an option, the collected first electromagnetic wave passes through a projection lens, such projection lens 932 in FIG. 9. In step S1004, the first electromagnetic wave transmitted through the projection lens is output onto a first region of a sample.

In FIG. 10, steps S1005 to S1008 describe the steps of operating the second electromagnetic wave source. In step S1005, a second electromagnetic wave, such as electromagnetic wave 908 of FIG. 9, is emitted from a second electromagnetic wave source in the backward direction and reaches to a reflector, such as reflector 906 of FIG. 9. The backward direction is opposite to the forward direction. The reflector changes the propagation direction of the second electromagnetic wave to the forward direction and collimates the second electromagnetic wave. A type of the second electromagnetic wave may be the same as or different from the type of the first electromagnetic wave. In step S1006, the reflected second electromagnetic wave is passed through a second diffuser, such as diffuser 924 of FIG. 9, facing the reflector. The second diffuser redistributes the reflected second electromagnetic wave by scattering mechanism. In step S1007, as an option, the diffused second electromagnetic wave is passed through the projection lens. In step S1008, the second electromagnetic waves outputted onto a second region of the sample. In step S1009, as a result of the operations of steps S1001-1008, the first electromagnetic wave and the second electromagnetic wave may simultaneously illuminate two different regions of the sample. For example, the first region may be illuminated by red light in electromagnetic spectrum while the second region may be illuminated by blue light in electromagnetic spectrum. The first region and the second region may be illuminated by the same electromagnetic wave having different intensities. For example, the first region may be illuminated with high intensity light while the second region is illuminated with low intensity light. The first and second regions may overlap or may not overlap. Also, by selecting different combinations of the first and second diffusers, the illumination method can provide various illumination areas having various angles of field of views or various quality of electromagnetic waves.

Figure 11:
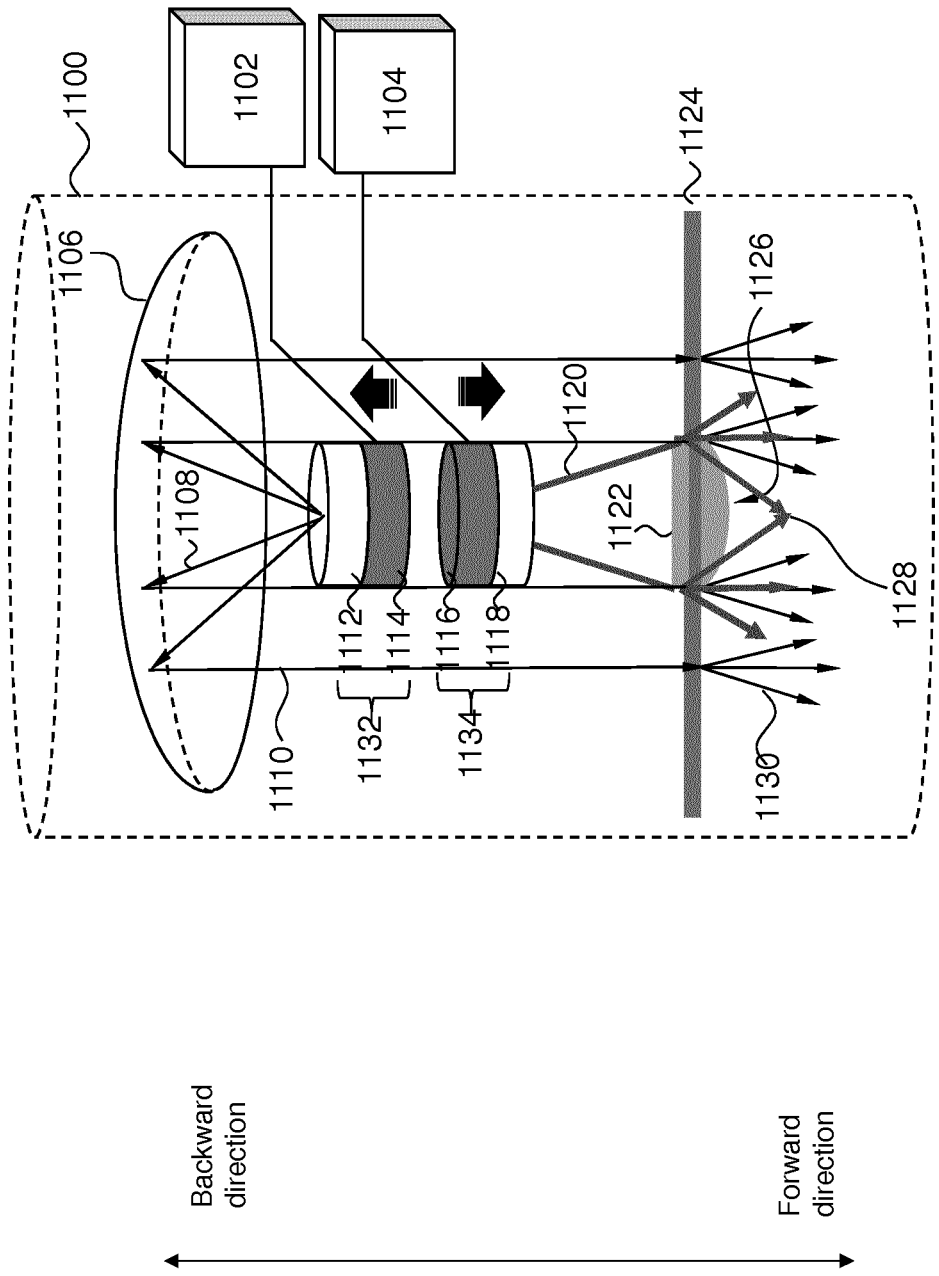
FIG. 11 is a schematic diagram illustrating another exemplary illumination unit having two electromagnetic wave sources movable from each other, consistent with some embodiments of the present disclosure.

References are now made to FIG. 11 a schematic diagram illustrating an exemplary illumination unit having two electromagnetic wave sources movable from each other, consistent with some exemplary embodiments of the present disclosure. As shown in FIG. 11, an illumination unit 1100 comprises a first electromagnetic wave source 1134 including an illumination surface 1118, a driver 1116 and a controller 1104. Driver 1116 includes circuitry configured to generate a first electromagnetic wave, for example, by transforming a type of energy into an electromagnetic wave 1120 that emitted through illumination surface 1118. Controller 1104 may control intensity of electromagnetic wave 1120 by controlling driver 1116. Driver 1116 further includes a first moving mechanism configured to move the first electromagnetic wave source in the forward-backward direction. The first moving mechanism may comprise a servo motor or a robotic arm or a magnetic levitation system or a magnetic force control system, among others. Controller 1104 may control a direction and a speed of the movement by controlling the circuitry of the first moving mechanism.

Illumination unit 1100 further comprises a second electromagnetic wave source 1132 including an illumination surface 1112, a driver 1114 and a controller 1102. Driver 1114 includes circuitry configured to generate a second electromagnetic wave 1108. Generated second electromagnetic wave 1108 emits through illumination surface 1112. Controller 1102 may control an intensity of electromagnetic wave 1108 by controlling driver 1114. Driver 1114 further includes a second moving mechanism configured to move second electromagnetic wave source 1132 in the forward-backward direction. The second moving mechanism may comprise a servo motor or a robotic arm or a magnetic levitation system or a magnetic force control system, among others. The first and second moving mechanisms may be the same or different. Controller 1102 may control a direction and a speed of the movement by controlling the circuitry of the second moving mechanism. The first and second electromagnetic wave sources are arranged in the form of back-to-back in which the first and second electromagnetic wave sources completely overlap or partially overlap each other. Controllers 1102 and 1104 may be included in drivers 1114 and 1116, respectively, or may be separated from drivers 1114 and 1116.

In some embodiments, illumination unit 1100 further comprises diffuser 1122, condenser 1126, reflector 1106, diffuser 1124 and, optionally, a projection lens (not shown, similar to projection lens 932 in FIG. 9). The function of diffuser 1122, condenser 1126, reflector 1106, diffuser 1124 and the projection lens are similar to the function of diffuser 922, condenser 928, reflector 906, diffuser 924 and projection lens 932, as shown in FIG. 9, and for brevity, detailed descriptions are omitted here. Electromagnetic wave 1110 diffused through diffuser 1124 merges with electromagnetic wave transmitted through condenser 1126 to form a large illumination area. Diffuser 1124 may be selected to have an angle of field of view smaller than that of diffuser 1122. Electromagnetic wave 1128 illuminates a first area of a sample and electromagnetic wave 1130 illuminates a second area of the sample. In this case, the second area surrounds the first area. The first and second illumination areas may be adjusted by moving the electromagnetic wave sources, for example, moving electromagnetic waver source 1132 towards reflector 1106 may increase the second illumination area and moving electromagnetic waver source 1132 towards diffuser 1122 may decrease the second illumination area. In this way, an illumination area or an angle of field of view may be instantly adjusted according to a requirement of a system. The first and second illumination areas may overlap or may not overlap.

Figure 12:
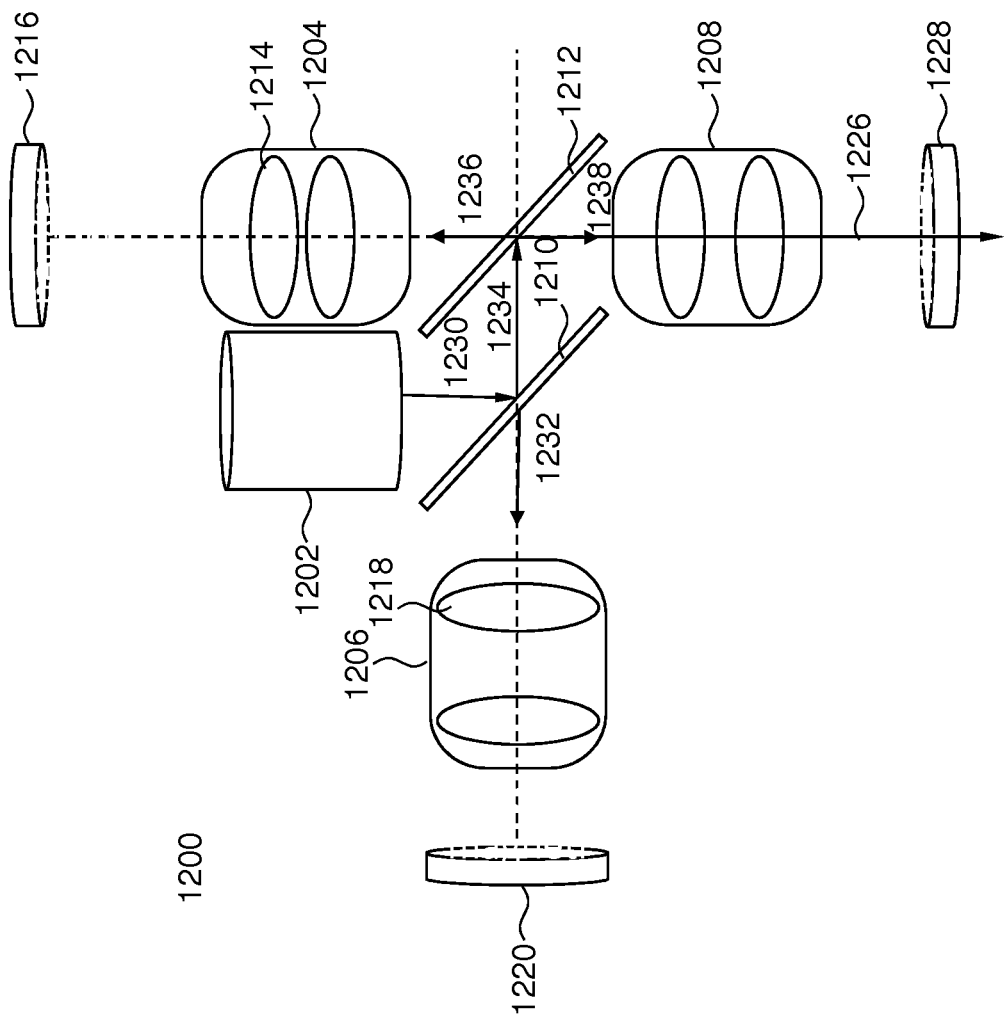
FIG. 12 illustrates an exemplary arrangement of an imaging system utilizing an illumination unit having two electromagnetic wave sources, consistent with some embodiments of the present disclosure.

References are now made to FIG. 12, an exemplary arrangement of an imaging system utilizing an illumination unit having two electromagnetic wave sources, consistent with some embodiments of the present disclosure. As shown in FIG. 12, an imaging system 1200 comprises an illumination unit 1202 having two electromagnetic wave sources, consistent with any one of the above described embodiments. Illumination unit 1202 is used as an illumination unit of the imaging system. Imaging system 1200 further comprises an objective lens 1208, a tube lens 1204, and a tube lens 1206, and two beam splitters 1210 and 1212. Beam splitters 1210 and 1212 may be made from two triangular glass prisms or a metal-coated mirror or a dichroic mirrored prism, among others. Beam splitter 1210 is configured to split an electromagnetic wave 1230 emitted from illumination unit 1202 into an electromagnetic wave 1232 and an electromagnetic wave 1234. Electromagnetic wave 1232 enters tube lens 1206 and electromagnetic wave 1234 enters beam splitter 1212. Beam splitter 1212 is configured to further split electromagnetic wave 1234 into an electromagnetic wave 1236 and an electromagnetic wave 1238, that enter tube lens 1204 and objective lens 1208, respectively. Objective lens 1208 may be a common objective. Tube lens 1204 may include a lens 1214 having a large focal length for a high magnification imaging system. Tube lens 1206 may include a lens 1218 having a small focal length for a low magnification imaging system. The electromagnetic waves transmitted through tube lens 1204, tube lens 1206, and objective lens 1208 illuminate samples 1216, 1220, and 1228, respectively. The illumination units disclosed in some embodiments of the present disclosure can be used in such an imaging system including high, normal, and low magnifications because it takes into account both small and large fields of view and adaptive adjustment of illumination area and field of view.

For example, as illustrated in the example of imaging system 1200 as shown in FIG. 12, common objective 1208 may be an objective with effective focal length about 85 mm and infinity corrected. Tube lens 1204 for a high magnification imaging system may be a lens with effective focal length about 215 mm. An object space NA (numerical aperture) of about 0.12 and a field of view of $\Phi=2.4$ mm may be achieved. Tube lens 1206 for a low magnification image system may be a lens with effective focal length about 42.5 mm. The object space NA of about 0.026 and field of view of $\Phi=12$ mm may be achieved. In this way, and by using illumination units disclosed in the present disclosure, an imaging system that covers high, normal, and low magnifications can be achieved with the help of beam splitters 1210 and 1212.

Figure 13:
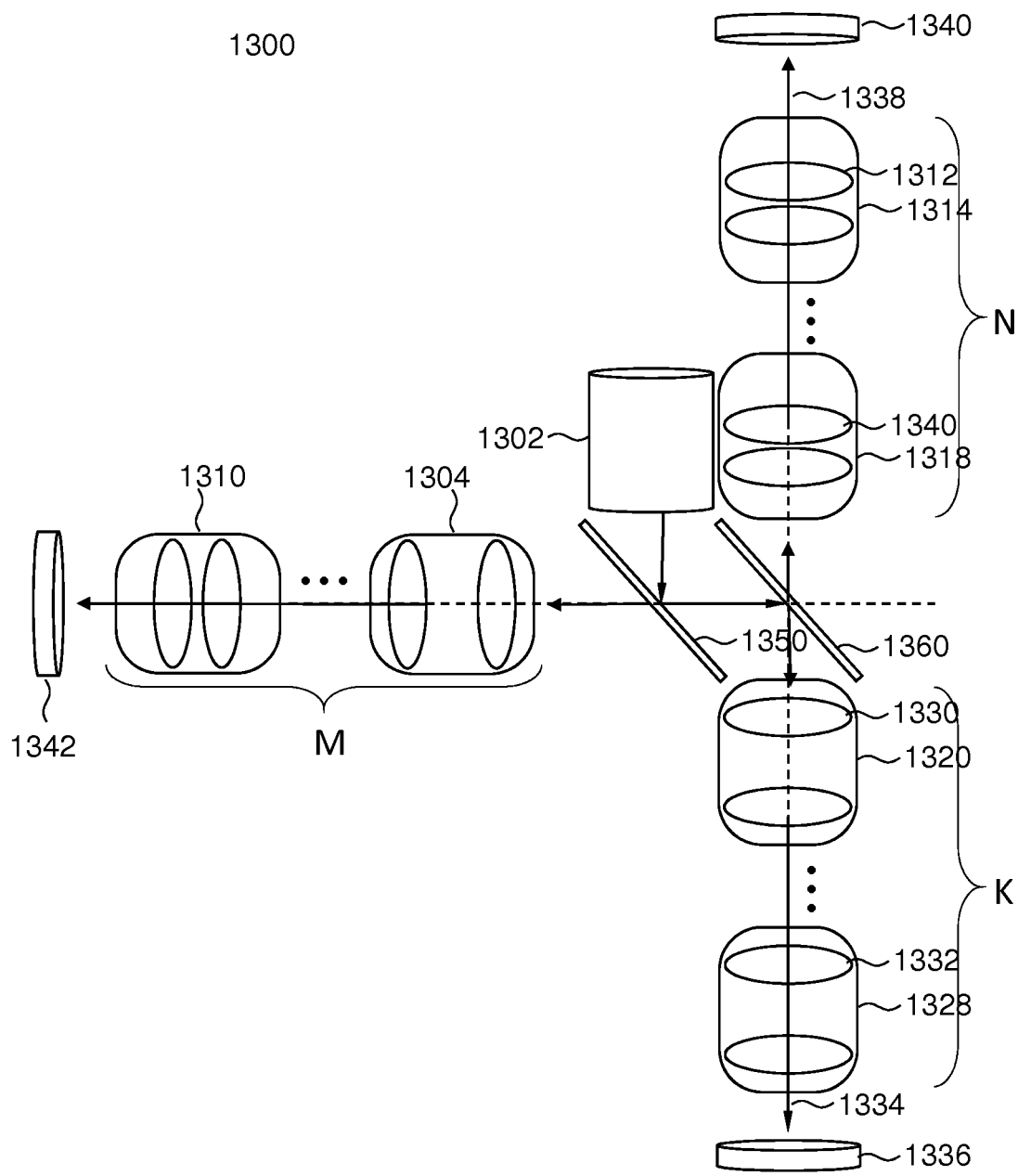
FIG. 13 illustrates another exemplary arrangement of an imaging system utilizing an illumination unit having two electromagnetic wave sources, consistent with some embodiments of the present disclosure.

References are now made to FIG. 13, an exemplary arrangement of an imaging system utilizing an illumination unit having two electromagnetic wave sources, consistent with some embodiments of the present disclosure. As shown in FIG. 13, an imaging system 1300 comprises an illumination unit 1302 having two electromagnetic wave sources, consistent with any one of the above described embodiments. Illumination unit 1302 is used as an illumination unit of the system. Imaging system 1300 further comprises arrays of lenses M, N, and K. Each array of lenses may comprise a plurality of lenses. In FIG. 13, array M comprises a plurality of common objectives, shown as objective 1304 . . . objective 1310; array N comprises a plurality of high magnification lenses, shown as lens 1314 . . . lens 1318; and array K comprises a plurality of low magnification lenses, shown as lens 1320 . . . lens 1328. Imaging system 1300 further comprises two beam splitters 1350 and 1360. Beam splitter 1350 splits electromagnetic wave emitted from illumination unit 1302 into two electromagnetic waves entering objective 1304 of the array M and beam splitter 1360, respectively. Beam splitter 1360 further splits electromagnetic wave transmitted from beam splitter 1350 into two electromagnetic waves that enter objectives 1320 of array K and objective 1318 of array N, respectively. The electromagnetic waves transmitted through the arrays of objectives M, N, and K illuminate samples 1342, 1340, and 1336, respectively. The illumination units disclosed in some embodiments of the present application can be used in such image systems because it takes into account both small and large field of view and adaptive adjustment of illumination area and field of view.

The embodiments may further be described using the following clauses:

1. An illumination unit, comprising:
   a first electromagnetic wave source including circuitry for outputting a first electromagnetic wave in a first direction to illuminate a first region of a sample;
   a second electromagnetic wave source including circuitry for outputting a second electromagnetic wave in a second direction substantially opposite to the first direction; and
   a reflector configured to reflect the second electromagnetic wave substantially in the first direction to illuminate a second region of the sample.

2. The illumination unit of clause 1, further comprising:
   a first controller including circuitry for controlling the first electromagnetic wave source; and
   a second controller including circuitry for controlling the second electromagnetic wave source, wherein the first controller and the second controller operate independently.

3. The illumination unit of clause 2, further comprising:
   a first moving mechanism controlled by the first controller to move the first electromagnetic wave source in the first direction.

4. The illumination unit of any one of clauses 2 to 3, further comprising:
   a second moving mechanism controlled by the second controller to move the second electromagnetic wave source in the second direction.

5. The illumination unit of any one of clauses 3 to 4, wherein the first moving mechanism or the second moving mechanism includes a servo motor, a robotic arm, a magnetic levitation system, or a magnetic force control system.

6. The illumination unit of clause 5, wherein the first moving mechanism or the second moving mechanism including a servo motor, a robotic arm, a magnetic levitation system, or a magnetic force control system includes the first moving mechanism and the second moving mechanism including one or more of a servo motor, a robotic arm, a magnetic levitation system, or a magnetic force control system.

7. The illumination unit of any one of clauses 1 to 6, further comprising:
   a first diffuser that faces an illumination surface of the first electromagnetic wave source and that is configured to diffuse the first electromagnetic wave outputted from the first electromagnetic wave source.

8. The illumination unit of clause 7, wherein a diameter of the reflector is larger than a diameter of the first diffuser.

9. The illumination unit of any one of clauses 7 to 8, further comprising:
   a condenser that faces the first diffuser and collimates the first electromagnetic wave diffused through the first diffuser.

10. The illumination unit of clause 9, wherein the condenser and the first diffuser are in contact.

11. The illumination unit of any one of clauses 9 to 10, wherein the condenser has substantially the same size as the first diffuser.

12. The illumination unit of any one of clauses 7 to 11, further comprising:
a second diffuser that faces the reflector and is configured to diffuse the second electromagnetic wave reflected from the reflector.

13. The illumination unit of clause 12, wherein a size of the second diffuser is larger than a size of the first diffuser.

14. The illumination unit of any one of clauses 12 to 13, wherein the first diffuser and the second diffuser are made of the same material.

15. The illumination unit of any one of clauses 12 to 13, wherein the first diffuser and the second diffuser are made of different materials.

16. The illumination unit of any one of clauses 7 to 15, further comprising:
a projection lens configured to project at least one of the first diffuser and the second diffuser to a predetermined location.

17. The illumination unit of clause 16, wherein a radius of the projection lens is substantially the same as a radius of the second diffuser.

18. The illumination unit of any one of clauses 1 to 17, wherein the first electromagnetic wave source and the second electromagnetic wave source are arranged back to back.

19. The illumination unit of any one of clauses 1 to 18, wherein the first electromagnetic wave and the second electromagnetic wave are a same type of electromagnetic wave.

20. The illumination unit of any one of clauses 1 to 18, wherein the first electromagnetic wave and the second electromagnetic wave are different types of electromagnetic waves.

21. The illumination unit of any one of clauses 1 to 20, wherein at least one of the first electromagnetic wave and the second electromagnetic wave is a broadband electromagnetic wave.

22. The illumination unit of any one of clauses 1 to 21, wherein a radius of the reflector is substantially two times of a distance between the reflector and the second electromagnetic wave source.

23. The illumination unit of any one of clauses 1 to 21, wherein the first region and the second region do not overlap each other.

24. The illumination unit of any one of clauses 1 to 21, wherein the first region and the second region partially overlap each other.

25. An illumination unit, comprising:
a first diffuser configured to diffuse a first electromagnetic wave from a first electromagnetic waver source onto a first region of a sample; and
a second diffuser configured to diffuse a second electromagnetic wave from a second electromagnetic waver source onto a second region of the sample,
wherein the first and second electromagnetic waves diffused from the first and second diffusers simultaneously illuminate the first and second regions of the sample.

26. The illumination unit of clause 25, wherein the first diffuser and the second diffuser overlap each other.

27. The illumination unit of any one of clauses 25 to 26, wherein a size of the first diffuser is smaller than a size of the second diffuser.

28. The illumination unit of clause 25, wherein the first diffuser is placed in a concave portion of the second diffuser such that the first diffuser and the second diffuser are placed on the same plane.

29. The illumination unit of any one of clauses 25 to 28, further comprising:
a reflector that reflects the second electromagnetic wave to a direction substantially the same as a propagation direction of the first electromagnetic wave.

30. An imaging system using the illumination unit of any one of clauses 1 to 29 as an illumination source.

31. The imaging system of clause 30, further comprising:
at least two tube-lenses having different numerical apertures.

32. The imaging system of any one of clauses 30 to 31, further comprising:
at least two tube-lenses having different fields of view.

33. The imaging system of clause 30, wherein:
the imaging system comprises a plurality of imaging systems;
at least one of the plurality of imaging systems comprises at least two tube-lenses having different numerical apertures; and
the first electromagnetic wave and the second electromagnetic wave reach the plurality of imaging systems by passing through at least one beam splitter.

34. An illumination device, comprising:
a first electromagnetic wave source including circuitry for outputting a first electromagnetic wave in a first direction;
a second electromagnetic wave source including circuitry for outputting a second electromagnetic wave in a second direction substantially opposite to the first direction;
a first beam expander that faces the first electromagnetic wave source and is configured to expand the outputted first electromagnetic wave to provide a first angle of field of view;
a beam collimator that faces the first beam expander and is configured to collimate the expanded first electromagnetic wave;
a beam reflector faces the second electromagnetic wave source and is configured to reflect the outputted second electromagnetic wave; and
a second beam expander that faces the beam reflector and is configured to expand the reflected second electromagnetic wave to provide a second angle of field of view.

35. The illumination device of clause 34, further comprising:
a projection lens configured to project at least one of the first beam expander and the second beam expander to a predetermined position.

36. An imaging system using the illumination device of any one of clauses 34 to 35 as an illumination source.

37. A method for illuminating a sample, comprising:
outputting a first electromagnetic wave in a first direction to illuminate a first region of the sample;
outputting a second electromagnetic wave in a second direction substantially opposite to the first direction; and
reflecting the second electromagnetic wave substantially in the first direction to illuminate a second region of the sample.

38. The method of clause 37, further comprising:
passing the first electromagnetic wave through a first beam expander.

39. The method of clause 38, further comprising:
passing the expanded first electromagnetic wave through a collimator; and
passing the reflected second electromagnetic wave through a second beam expander.

40. The method of clause 39, further comprising:
passing the collimated first electromagnetic wave and the expanded second electromagnetic wave through a projection lens.

While the previously mentioned embodiments are directed to illuminating a sample, the described embodiments could be used in other fields. For example, in life science and medical studies, physiological parameters (e.g., blood flow, oxygen consumption, concentration of tissue metabolites such as hemoglobin) can be measured by determining optical property of tissues, for example, by measuring an absorption of a light at one or more wavelengths by the tissues. It is desirable to be able to simultaneously gather different physiological data, for example, simultaneously monitoring in real time of tissue parameters such as tissue oxygenation and total blood volume, using different light wavelengths.

Example embodiments are described above with reference to flowchart illustrations or block diagrams of methods, apparatus (systems) and computer program products. It will be understood that each block of the flowchart illustrations or block diagrams, and combinations of blocks in the flowchart illustrations or block diagrams, can be implemented using computer program instructions (e.g., by passing instructions to the various controllers shown in FIGS. 1, 4, 7, 9, and 11). These computer program instructions may be provided to a processor of a computer, or other programmable data processing apparatus to produce a machine, such that the instructions, which execute via the processor of the computer or other programmable data processing apparatus, create means for implementing the functions/acts specified in the flowchart or block diagram block or blocks.

These computer program instructions may also be stored in a computer readable medium that can direct a hardware processor core of a computer, other programmable data processing apparatus, or other devices to function in a particular manner, such that the instructions stored in the computer readable medium form an article of manufacture including instructions that implement the function/act specified in the flowchart or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart or block diagram block or blocks.

Any combination of one or more computer readable medium(s) may be utilized. The computer readable medium may be a non-transitory computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM, EEPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, IR, etc., or any suitable combination of the foregoing.

Computer program code for carrying out operations for example embodiments may be written in any combination of one or more programming languages, including an object-oriented programming language such as Java, Smalltalk, C++ or the like and conventional procedural programming languages, such as the "C" programming language or similar programming languages.

The flowchart and block diagrams in the Figures illustrate examples of the architecture, functionality, and operation of possible implementations of systems, methods and computer program products according to various embodiments. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

It is understood that the described embodiments are not mutually exclusive, and elements, components, materials, or steps described in connection with one example embodiment may be combined with, or eliminated from, other embodiments in suitable ways to accomplish desired design objectives.

Reference herein to "some embodiments" or "some exemplary embodiments" mean that a particular feature, structure, or characteristic described in connection with the embodiment can be included in at least one embodiment. The appearance of the phrases "one embodiment" "some embodiments" or "some exemplary embodiments" in various places in the specification do not all necessarily refer to the same embodiment, nor are separate or alternative embodiments necessarily mutually exclusive of other embodiments.

It should be understood that the steps of the example methods set forth herein are not necessarily required to be performed in the order described, and the order of the steps of such methods should be understood to be merely example. Likewise, additional steps may be included in such methods, and certain steps may be omitted or combined, in methods consistent with various embodiments.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word is intended to present concepts in a concrete fashion.

Unless explicitly stated otherwise, each numerical value and range should be interpreted as being approximate as if a word such as "about" or "approximately" or the like preceded the value of the value or range.

The use of figure numbers or figure reference labels in the claims is intended to identify one or more possible embodiments of the claimed subject matter to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

It will be further understood that various changes in the details, materials, and arrangements of the parts which have been described and illustrated in order to explain the nature of described embodiments may be made by those skilled in the art without departing from the scope as expressed in the following claims.

The invention claimed is:

1. An illumination unit, comprising:
 a first electromagnetic wave source including circuitry for outputting a first electromagnetic wave in a first direction to illuminate a first region of a sample;
 a second electromagnetic wave source including circuitry for outputting a second electromagnetic wave in a second direction substantially opposite to the first direction; and
 a reflector configured to reflect and collimate the second electromagnetic wave substantially in the first direction to illuminate a second region of the sample.

2. The illumination unit of claim 1, further comprising:
 a first controller including circuitry for controlling the first electromagnetic wave source; and
 a second controller including circuitry for controlling the second electromagnetic wave source, wherein the first controller and the second controller operate independently.

3. The illumination unit of claim 2, further comprising:
 a first moving mechanism controlled by the first controller to move the first electromagnetic wave source in the first direction.

4. The illumination unit of claim 2, further comprising:
 a second moving mechanism controlled by the second controller to move the second electromagnetic wave source in the second direction.

5. The illumination unit of claim 4, wherein the first moving mechanism or the second moving mechanism includes a servo motor, a robotic arm, a magnetic levitation system, or a magnetic force control system.

6. The illumination unit of claim 5, wherein the first moving mechanism or the second moving mechanism including a servo motor, a robotic arm, a magnetic levitation system, or a magnetic force control system includes the first moving mechanism and the second moving mechanism including one or more of a servo motor, a robotic arm, a magnetic levitation system, or a magnetic force control system.

7. The illumination unit of claim 1, further comprising:
 a first diffuser that faces an illumination surface of the first electromagnetic wave source and that is configured to diffuse the first electromagnetic wave outputted from the first electromagnetic wave source.

8. The illumination unit of claim 7, wherein a diameter of the reflector is larger than a diameter of the first diffuser.

9. The illumination unit of claim 7, further comprising:
 a condenser that faces the first diffuser and collimates the first electromagnetic wave diffused through the first diffuser.

10. The illumination unit of claim 9, wherein the condenser and the first diffuser are in contact.

11. The illumination unit of claim 9, wherein the condenser has substantially the same size as the first diffuser.

12. The illumination unit of claim 7, further comprising:
 a second diffuser that faces the reflector and is configured to diffuse the second electromagnetic wave reflected from the reflector.

13. The illumination unit of claim 12, wherein a size of the second diffuser is larger than a size of the first diffuser.

14. The illumination unit of claim 12, wherein the first diffuser and the second diffuser are made of the same material.

15. A method for illuminating a sample, comprising:
 outputting a first electromagnetic wave in a first direction to illuminate a first region of the sample;
 outputting a second electromagnetic wave in a second direction substantially opposite to the first direction; and
 reflecting and collimating the second electromagnetic wave substantially in the first direction to illuminate a second region of the sample.

16. A non-transitory computer readable medium that stores a set of instructions that is executable by at least on processor of a computing device to cause the computing device to perform operations for illuminating a sample, the operations comprising:
 causing emission of a first electromagnetic wave in a first direction to illuminate a first region of the sample;
 causing emission of a second electromagnetic wave in a second direction substantially opposite to the first direction; and
 causing reflection and collimation of the second electromagnetic wave substantially in the first direction to illuminate a second region of the sample.

17. The non-transitory computer readable medium of claim 16, wherein the operations further comprise controlling a first moving mechanism to move the first electromagnetic wave in the first direction.

18. The non-transitory computer readable medium of claim 17, wherein the operations further comprise controlling a second moving mechanism to move the second electromagnetic wave in the second direction.

19. The non-transitory computer readable medium of claim 18, wherein controlling the first moving mechanism or controlling the second moving mechanism includes controlling one of a servo motor, a robotic arm, a magnetic levitation system, or a magnetic force control system.

* * * * *